(12) United States Patent
Baumgartner et al.

(10) Patent No.: US 7,882,473 B2
(45) Date of Patent: Feb. 1, 2011

(54) SEQUENTIAL EQUIVALENCE CHECKING FOR ASYNCHRONOUS VERIFICATION

(75) Inventors: Jason R. Baumgartner, Austin, TX (US); Yee Ja, Round Rock, TX (US); Hari Mony, Austin, TX (US); Viresh Paruthi, Austin, TX (US); Barinjato Ramanandray, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 381 days.

(21) Appl. No.: 11/945,465

(22) Filed: Nov. 27, 2007

(65) Prior Publication Data

US 2009/0138837 A1    May 28, 2009

(51) Int. Cl.
G06F 17/50 (2006.01)
G06F 9/45 (2006.01)

(52) U.S. Cl. .............. 716/6; 716/4; 716/5; 326/93; 326/94; 326/95; 326/96; 327/1; 327/2; 327/3; 327/40; 327/41; 703/13; 703/14; 703/15; 703/16; 703/19

(58) Field of Classification Search ............... 716/4–6; 326/93–96; 327/1–3, 40–41; 703/13–16, 703/19
See application file for complete search history.

(56) References Cited

U.S. PATENT DOCUMENTS

| | | | |
|---|---|---|---|
| 4,011,465 A | 3/1977 | Alvarez, Jr. | |
| 5,287,289 A | 2/1994 | Kageyama et al. | |
| 5,396,435 A | 3/1995 | Ginetti | |
| 5,426,651 A | 6/1995 | Van De Burgt | |
| 5,452,239 A | 9/1995 | Dai et al. | |
| 5,477,474 A | 12/1995 | Southgate et al. | |
| 5,499,192 A | 3/1996 | Knapp et al. | |
| 5,504,690 A | 4/1996 | Kageyama et al. | |
| 5,526,517 A | 6/1996 | Jones et al. | |
| 5,586,047 A | 12/1996 | Imahashi | |
| 5,649,165 A | 7/1997 | Jain et al. | |
| 5,659,484 A | 8/1997 | Bennett et al. | |
| 5,678,040 A | 10/1997 | Vasudevan et al. | |
| 5,790,830 A | 8/1998 | Segal | |

(Continued)

OTHER PUBLICATIONS

U.S. Appl. No. 11/457,865, filed Jul. 17, 2006, Gass et al.

(Continued)

Primary Examiner—Nghia M Doan
(74) Attorney, Agent, or Firm—Stephen J Walder, Jr.; Diana R. Gerhardt

(57) ABSTRACT

Mechanisms for performing sequential equivalence checking for asynchronous verification are provided. A first model of the integrated circuit design is provided that has additional logic in it to reflect the possible variance in behavior of the asynchronous crossings. A second model of the integrated circuit design is provided that does not have this asynchronous behavior logic but instead correlates to the simplest synchronous model that is usually used for non-asynchronous functional verification tasks. Sequential equivalence checking is performed to verify that the two models are input/output equivalent. In order to address non-uniform arrival times of bus strands, logic is provided for identifying bus strands that have transitioning bits, determining a representative delay for these strands, comparing the representative delays for all of the bus strands to determine the maximum delay for the entire bus, and applying this maximum delay to one of the models.

21 Claims, 10 Drawing Sheets

U.S. PATENT DOCUMENTS

| | | | |
|---|---|---|---|
| 5,828,860 | A | 10/1998 | Miyaoku et al. |
| 5,926,622 | A | 7/1999 | Hardin et al. |
| 5,956,257 | A | 9/1999 | Ginetti et al. |
| 5,958,077 | A | 9/1999 | Banerjee et al. |
| 5,966,523 | A | 10/1999 | Uchino |
| 5,995,425 | A | 11/1999 | Henkels et al. |
| 6,023,568 | A | 2/2000 | Segal |
| 6,026,222 | A | 2/2000 | Gupta et al. |
| 6,049,662 | A | 4/2000 | Saha et al. |
| 6,052,524 | A | 4/2000 | Pauna |
| 6,056,784 | A | 5/2000 | Stanion |
| 6,058,252 | A | 5/2000 | Noll et al. |
| 6,071,003 | A | 6/2000 | Ashuri et al. |
| 6,074,426 | A | 6/2000 | Baumgartner et al. |
| 6,077,304 | A | 6/2000 | Kasuya |
| 6,086,626 | A | 7/2000 | Jain et al. |
| 6,182,258 | B1 | 1/2001 | Hollander |
| 6,195,776 | B1 | 2/2001 | Ruiz et al. |
| 6,205,559 | B1 | 3/2001 | Sakaguchi |
| 6,216,219 | B1 | 4/2001 | Cai et al. |
| 6,240,543 | B1 | 5/2001 | Bhandari |
| 6,247,165 | B1 | 6/2001 | Wohl et al. |
| 6,301,687 | B1 | 10/2001 | Jain et al. |
| 6,308,299 | B1 | 10/2001 | Burch et al. |
| 6,321,184 | B1 | 11/2001 | Baumgartner et al. |
| 6,374,393 | B1 | 4/2002 | Hirairi |
| 6,446,243 | B1 | 9/2002 | Huang et al. |
| 6,470,481 | B2 | 10/2002 | Brouhard et al. |
| 6,516,449 | B2 * | 2/2003 | Masud ............ 716/3 |
| 6,553,514 | B1 | 4/2003 | Baumgartner et al. |
| 6,560,758 | B1 | 5/2003 | Jain |
| 6,587,993 | B2 | 7/2003 | Shoyama |
| 6,643,829 | B1 | 11/2003 | Borkovic et al. |
| 6,643,832 | B1 | 11/2003 | Ray et al. |
| 6,687,882 | B1 | 2/2004 | McElvain et al. |
| 6,698,003 | B2 | 2/2004 | Baumgartner et al. |
| 6,714,902 | B1 | 3/2004 | Chao et al. |
| 6,816,825 | B1 | 11/2004 | Ashar et al. |
| 6,868,535 | B1 | 3/2005 | Podkolzin et al. |
| 6,959,271 | B1 | 10/2005 | Ballam |
| 6,973,632 | B1 | 12/2005 | Brahme et al. |
| 7,020,589 | B1 | 3/2006 | Datta Ray et al. |
| 7,086,016 | B2 | 8/2006 | Matsuzaki et al. |
| 7,194,715 | B2 | 3/2007 | Charlebois et al. |
| 7,240,311 | B2 | 7/2007 | Lai et al. |
| 7,257,524 | B2 | 8/2007 | Schilp et al. |
| 7,260,799 | B2 | 8/2007 | Baumgartner et al. |
| 7,301,362 | B2 * | 11/2007 | Jang et al. ............ 326/9 |
| 7,302,659 | B2 | 11/2007 | Ja et al. |
| 7,340,698 | B1 | 3/2008 | Srinivasan et al. |
| 7,447,620 | B2 | 11/2008 | Hidvegi et al. |
| 7,490,305 | B2 | 2/2009 | Gass et al. |
| 2001/0020289 | A1 | 9/2001 | Pavisic et al. |
| 2002/0188910 | A1 | 12/2002 | Zizzo |
| 2003/0023941 | A1 | 1/2003 | Wang et al. |
| 2003/0061470 | A1 | 3/2003 | Yeh |
| 2004/0103387 | A1 | 5/2004 | Teig et al. |
| 2004/0225977 | A1 | 11/2004 | Akkerman |
| 2004/0233742 | A1 | 11/2004 | Morzano |
| 2004/0250226 | A1 | 12/2004 | Lin et al. |
| 2005/0246673 | A1 | 11/2005 | Charlebois et al. |
| 2005/0273748 | A1 | 12/2005 | Hetzel et al. |
| 2006/0095879 | A1 | 5/2006 | Brahme et al. |
| 2006/0122817 | A1 | 6/2006 | Baumgartner et al. |
| 2006/0190860 | A1 | 8/2006 | Ng et al. |
| 2006/0190873 | A1 | 8/2006 | Baumgartner et al. |
| 2006/0190883 | A1 * | 8/2006 | Ja et al. ............ 716/6 |
| 2006/0239392 | A1 | 10/2006 | Cummings et al. |
| 2007/0033551 | A1 | 2/2007 | Greaves et al. |
| 2007/0198238 | A1 | 8/2007 | Hidvegi et al. |
| 2007/0271542 | A1 * | 11/2007 | Ja et al. ............ 716/12 |
| 2008/0295052 | A1 | 11/2008 | Hidvegi et al. |

OTHER PUBLICATIONS

Xie et al., "Design of Robust-Path-Delay-Fault-Testable Combinational Circuits by Boolean Space Expansion", IEEE 1992 International Conference on Computer Design: VLSI in Computers and Processors, Oct. 11-14, 1992, pp. 482-485.

Miyamoto et al., "An Efficient Algorithm for Deriving Logic Functions of Asynchronous Circuits", Proceedings of Second International Symposium on Advanced Research in Asynchronous Circuits and Systems, Mar. 18-21, 1996, pp. 30-35.

Gharaybeh et al., "False-Path Removal Using Delay Fault Simulation", Proceedings of Seventh Asian Test Symposium, Dec. 2-4, 1998, pp. 82-87.

Bjesse et al., "SAT-Based Verification without State Space Traversal", FMCAD 2000, LNCS 1954, Springer-Verlag Berlin Heidelberg 2000, Nov. 1-3, 2000, pp. 372-389.

C.A.J. Van Eijk, "Sequential Equivalence Checking without State Space Traversal", Proceedings of Design, Automation and Test in Europe, Feb. 23-26, 1998, IEEE Computer Society, Los Alamitos, California, pp. 618-623.

USPTO U.S. Appl. No. 11/054,903, Image File Wrapper printed Aug. 26, 2010, 2 pages.

USPTO U.S. Appl. No. 11/054,904, Image File Wrapper printed Aug. 26, 2010, 2 pages.

USPTO U.S. Appl. No. 11/360906, Image File Wrapper printed Aug. 26, 2010, 2 pages.

USPTO U.S. Appl. No. 12/168,888, Image File Wrapper printed Aug. 26, 2010, 1 page.

Burch, Jerry R. et al., "Symbolic Model Checking for Sequential Circuit Verification", IEEE Transactions on Computer-Aided Design of Integrated Circuits and Systems, vol. 13, Apr. 1994, pp. 401-424.

East, RE, "Modelling Technique for Master/Slave LSSD Latches with Gated Clocks", IBM Technical Disclosure Bulletin, vol. 36, No. 09A, Sep. 1993, pp. 155-157.

Forlenza, Do, "Latch Model Reduction Using Latch Behaviorals", IBM Technical Disclosure Bulletin, vol. 31, No. 09, Feb. 1989, pp. 471-473.

Gerst, Harald, "A general Method to double the Cycle Simulation Speed", Proceedings of the Tenth Annual IEEE International ASIC Conference and Exhibit, Sep. 1997, pp. 356-359.

Kahle, Ja, "Single-Latch Element Modeling Technique", IBM Technical Disclosure Bulletin, vol. 36, No. 08, Aug. 1993, pp. 355-356.

Notice of Allowance mailed Oct. 4, 2010 for U.S. Appl. No. 12/168,888; 15 pages.

* cited by examiner

SEQUENTIAL EQUIVALENCE CHECKING FOR ASYNCHRONOUS VERIFICATION

BACKGROUND

1. Technical Field

The present application relates generally to an improved data processing system and method. More specifically, the present application is directed to a system and method for sequential equivalence checking for asynchronous verification.

2. Description of Related Art

Asynchronous verification is the process of verifying that integrated circuit designs with asynchronous crossings work correctly, i.e. that the logic will not behave inconsistently due to differences in timing conditions between two communicating clock regions. Verification of integrated circuit designs with asynchronous crossings is typically done by employing additional logic in simulation models of the integrated circuit design to thereby model the asynchronous crossing. User defined assertions/properties are then added to verify that the design conforms to its specification. Traditionally, this verification is done using simulation based techniques (user-defined as well as random test cases). However, it is difficult to model and verify the designs in simulation since the development of a test bench that exercises every possible combination of signals is a daunting task. Formal and semi-formal techniques can be used, which have the power to expose even the most probabilistically uncommon scenario that may result in a functional design failure, and ultimately have the power to prove that the design is correct, i.e. that no failing scenario exists. Developing a formal test bench for asynchronous verification is a time-consuming process without which formal techniques cannot directly provide benefit to such problems.

Much progress has been made in this area with the development of techniques/tools which try to automatically add assertions by analyzing the design. However, such techniques/tools are still incomplete, and often require specific design styles to work whatsoever. It is very difficult to assess whether the added assertions are complete, i.e. if there is a risk of a missed bug even if all the added assertions are proven correct. Presently, this is done through manual inspection by designers/verification engineers who will try to ensure that all needed assertions/properties have been added. Furthermore, the process of constraining input stimuli to avoid failures of the properties is an almost entirely manual process. The reliance on manual procedures greatly increases the amount of time to perform the verification process as well as increases the possibility of errors since human beings are prone to err.

SUMMARY

The illustrative embodiments provide a system and method for performing sequential equivalence checking for asynchronous verification. In particular, the illustrative embodiments provide a system and method for verifying that an asynchronous crossing in an integrated circuit design operates properly. In one illustrative embodiment, such a system and method may be used to verify asynchronous buses using sequential equivalence checking.

In one illustrative embodiment, an automatic mechanism is provided for formally proving that a design with asynchronous crossings behaves consistently. With the illustrative embodiment, two models are built of the integrated circuit design. A first model of the integrated circuit design is provided that has additional logic in it to reflect the possible variance in behavior of the asynchronous crossings. A second model of the integrated circuit design is provided that does not have this asynchronous behavior logic but instead correlates to the simplest synchronous model that is usually used for non-asynchronous functional verification tasks. Given these two models, sequential equivalence checking is performed to verify that the two models are input/output equivalent. The term "sequential equivalence checking" refers to the verification that two or more models are input/output equivalent.

For example, in one illustrative embodiment, a first netlist of the integrated circuit design is generated in which additional logic is added to model the asynchronous crossings. A second netlist of the integrated circuit design is also generated that does not include the additional logic for modeling the asynchronous crossings. Sequential equivalence checking is then performed to determine whether the first netlist and the second netlist are input/output equivalent. If all of the outputs are proven to be equivalent, then the first and second netlist are determined to be sequentially equivalent and the asynchronous crossings are determined to be consistent. If any of the outputs are not proven equivalent, the trace of the simulation for performing the sequential equivalent checking is analyzed. If the trace indicates a false failure, the check for output equivalence is modified and the sequential equivalent checking is again performed. If the trace indicates a real failure, the integrated circuit design needs to be modified to fix the problem and the operation is repeated once the integrated circuit design is appropriately modified. Each of these operations is detailed in the following description of the illustrative embodiments.

Thus, the mechanisms of the illustrative embodiments allow sequential equivalence checking for asynchronous verification of integrated circuit designs. These mechanisms of the illustrative embodiments may be applied to a number of different types of integrated circuit designs. With regard to data bus designs, however, additional considerations may be required to account for delays on each individual strand of a data bus. That is, the mechanisms of the illustrative embodiments above may be implemented for each individual strand of a data bus such that each strand has its own skew logic. However, in addition to the skew within a single strand, the asynchronous problems associated with non-uniform arrival times of the bus strands may also be accounted for.

In order to address such non-uniform arrival times of bus strands, the illustrative embodiments further provide logic for identifying bus strands of an asynchronous bus that have transitioning bits. For these bus strands, a representative delay is dynamically determined. The representative delays for all of the transitioning bus strands are compared to each other to determine the maximum delay for the entire bus. This maximum delay is then used to drive select signals to a multiplexer of the skew logic in one copy of the circuit model while, in another copy of the circuit model, the skew logic is randomly driven. These two models, which together constitute a joint model, may then be subjected to a verification framework, which may include simulation, emulation, formal equivalence checking, and the like, to determine if the original circuit model is asynchronously verified. An output indicative of the results of the verification may be generated and output for use by a user. These operations of the illustrative embodiments are based on the notion that the slowest/last arriving strand value of a bus determines the validity of the bus value as a whole. That is, the bus value, as a whole, is valid at its destination once all transitioning values from the source arrive.

In one illustrative embodiment, a method for performing asynchronous verification of an integrated circuit design is provided. The method may comprise receiving a first model of the integrated circuit design, unfolding paths within the first model that have asynchronous crossings to generate an unfolded integrated circuit design model, and inserting asynchronous crossing logic into the unfolded integrated circuit design model to generate a second model. The method may further comprise correlating outputs of the first model with outputs of the second model, applying one or more exclusive OR operations to the correlated outputs of the first model and the second model, and performing sequential equivalence checking on the first model and second model utilizing the applied one or more exclusive OR operations.

Moreover, the method may comprise determining, based on outputs of the one or more exclusive OR operations due to the sequential equivalence checking, whether the asynchronous crossings of the integrated circuit design are verified or not verified. An output may be generated indicative of whether the asynchronous crossings of the integrated circuit design are verified or not verified based on results of the determination.

The method may further comprise performing a failure analysis to determine if a failure of the asynchronous crossings is a real failure or a false failure in response to determining that the asynchronous crossings of the integrated circuit design are not verified. Moreover, the method may comprise determining if results of the failure analysis indicate a false failure of the asynchronous crossings and generating an output indicating a real failure of the integrated circuit design and a need to modify the integrated circuit design if results of the failure analysis indicate a real failure occurred with the asynchronous crossings of the integrated circuit design. The method may also comprise determining if results of the failure analysis indicate a false failure of the asynchronous crossings and generating an output indicating a false failure of the integrated circuit design and a need to modify the sequential equivalence checking of the first model and second model if results of the failure analysis indicate a false failure occurred with the asynchronous crossings of the integrated circuit design.

The asynchronous crossing logic may comprise skewing logic for randomly selecting a phase difference between clocks of asynchronous domains of asynchronous crossings in the unfolded integrated circuit design. The asynchronous crossing logic may further comprise, for an asynchronous bus in the unfolded integrated circuit design, transitioning bit detection logic for detecting transitioning bits of strands of the asynchronous bus, and maximum delay logic for determining a maximum delay of strands having transitioning bits in the asynchronous bus. In such a case, inserting the asynchronous crossing logic may further comprise replicating the second model to generate a third model and coupling, for the asynchronous bus in the second model, the maximum delay logic of the second model to random select inputs of the skewing logic associated with a corresponding asynchronous bus in the third model to thereby bypass the random select inputs.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide a mechanism for performing sequential equivalence checking for asynchronous verification of integrated circuit designs. Moreover, in some illustrative embodiments, the mechanism may be used to perform verification of asynchronous buses using sequential equivalence checking. The illustrative embodiments may be implemented in a single data processing system or may be distributed across a plurality of data processing systems that are coupled to one another via one or more communications networks. For example, a server computing device may provide a circuit model analysis engine that may operate on circuit models provided by other computing devices, such as a client computing device. A client computing device may communicate with the server computing device via one or more communications networks so as to control the application of the circuit model analysis, in accordance with the illustrative embodiments, to circuit models which may be provided initially as Hardware Description Language (HDL) files and converted to one or more netlist data structures, for example. Alternatively, the circuit models and analysis engine may be provided entirely on the same computing device such that multiple computing devices and communication networks are not necessary. For purposes of the present description, however, it will be assumed that the illustrative embodiments are implemented in a distributed data processing system.

Figure 1:
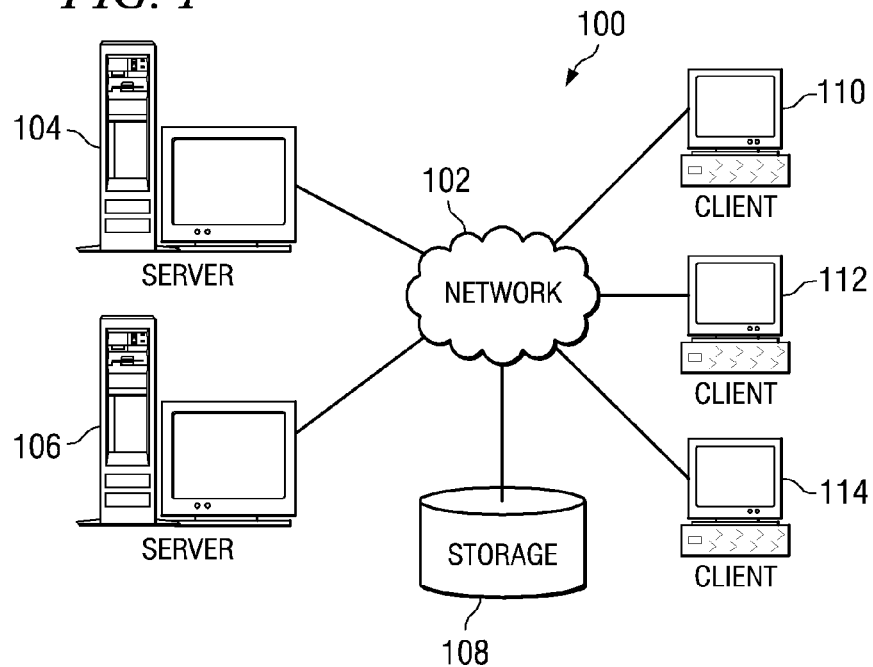
FIG. 1 is an exemplary representation of an exemplary distributed data processing system in which aspects of the illustrative embodiments may be implemented.
Figure 2:
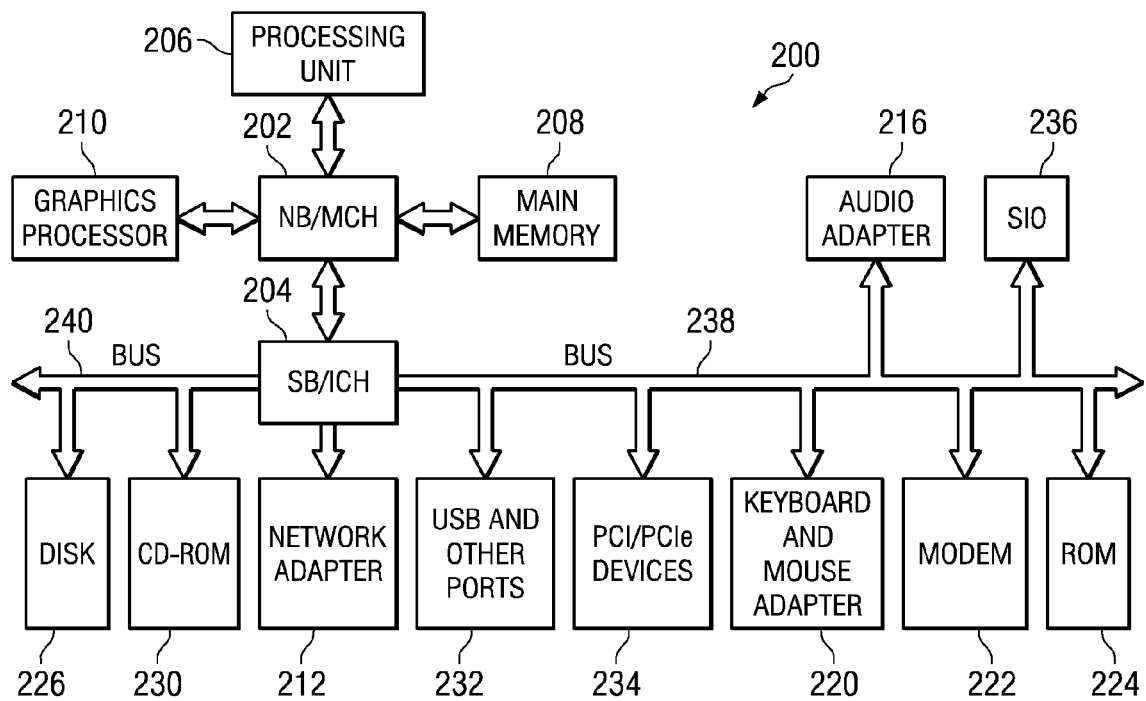
FIG. 2 is a block diagram of an exemplary data processing system in which aspects of the illustrative embodiments may be implemented.

With reference now to the figures and in particular with reference to FIGS. 1-2, exemplary diagrams of data processing environments are provided in which embodiments of the present invention may be implemented. It should be appreciated that FIGS. 1-2 are only exemplary and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an exemplary distributed data processing system in which aspects of the illustrative embodiments may be implemented. Distributed data processing system 100 may include a network of computers in which embodiments of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an exemplary data processing system is shown in which aspects of the illustrative embodiments may be implemented. Data processing system 200 is an example of a computer, such as server 104 or client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

The illustrative embodiments provide a system and method for automatically performing sequential equivalence checking of an integrated circuit design so as to verify consistent operation of any asynchronous crossings in the design. In this way, the mechanisms of the illustrative embodiments may be used to automatically verify the proper, or improper, operation of an integrated circuit design having asynchronous crossings without relying on manual specification of assertions to catch bugs in the design due to the present of the asynchronous crossings. This not only avoids the error-prone manual analysis required in the prior art to ensure that all the needed assertions are in place, but it also dramatically improves the verification time since the human designers/verification engineers do not have to devote costly man-hours to add assertions. The illustrative embodiments further eliminate the need to write input constraints for a test bench. Moreover, the mechanisms of the illustrative embodiments use formal techniques and provide a complete proof that the integrated circuit design operates correctly, or incorrectly. Hence, the human designers/verification engineers do not need to worry about any missing scenarios that were not checked during verification.

With reference again to FIG. 1, the server 104 may provide, among other analysis tools, a sequential equivalence analysis engine in accordance with the mechanisms of the illustrative embodiments. A client computing device, such as client 110, may provide a circuit model to the server 104 upon which the sequential equivalence analysis engine of server 104 is to operate in order to verify the design of the circuit with regard to any asynchronous crossings. This circuit model may comprise, for example, a netlist data structure defining the various nets of the circuit model. Alternatively, the circuit model may be provided in a high level design language, such as a hardware design language (HDL), which may be converted to a netlist for use with the illustrative embodiments.

It should be appreciated that while the illustrative embodiments will be described with regard to nets in a netlist data structure, the present invention is not limited to use of a netlist data structure. Rather, other types of data structures that provide a logic description representative of a circuit design may be used without departing from the spirit and scope of the present invention.

The netlist or high level design representation of the circuit design may be input to the sequential equivalence analysis engine of the server 104 as the circuit model. The sequential equivalence analysis engine, based on the circuit model, generates a netlist having additional logic for modeling the asynchronous crossings of the input circuit model. If the circuit model is not already in a netlist form, then a second netlist that does not have the additional logic for modeling the asynchronous crossings is also generated. The sequential equivalence analysis engine then performs sequential equivalence checking on the two netlists to determine whether the first netlist and the second netlist are input/output equivalent. If all of the outputs are proven to be equivalent, then the first and second netlist are determined to be sequentially equivalent and the asynchronous crossings are determined to be consistent. If any of the outputs are not proven equivalent, a trace of the simulation for performing the sequential equivalent checking is analyzed. If the trace indicates a false failure, the check for output equivalence is modified and the sequential equivalence checking is again performed. If the trace indicates a real failure, the integrated circuit design needs to be modified to fix the problem and the operation is repeated once the integrated circuit design is appropriately modified. Appropriate outputs to a human designer/verification engineer may be provided via the client 110, or other workstation, to inform the human designer/verification engineer of the results of the sequential equivalence checking of the two netlists. In this way, the human designer/verification engineer is informed whether the integrated circuit design is verified to operate properly, whether a false failure was detected and thus, a modification to the sequential equivalence checking is required, or whether a real failure was detected and thus, modification of the integrated circuit design is required.

As discussed above, a first operation performed by the mechanisms of the illustrative embodiments is to generate a model of the integrated circuit design that includes additional logic to model the asynchronous crossings. This first operation is performed by transforming the original model of the integrated circuit device by inserting clock signal phase difference selection logic and performing path replication on logic associated with asynchronous crossings in the original model. The insertion of this clock signal phase difference selection logic and the use of path replication results in certain conditions, i.e. glitch conditions, which may occur in the transformed model having the logic representing the asynchronous crossings that otherwise would not occur in the model in which asynchronous crossing logic is not present.

Figure 3:
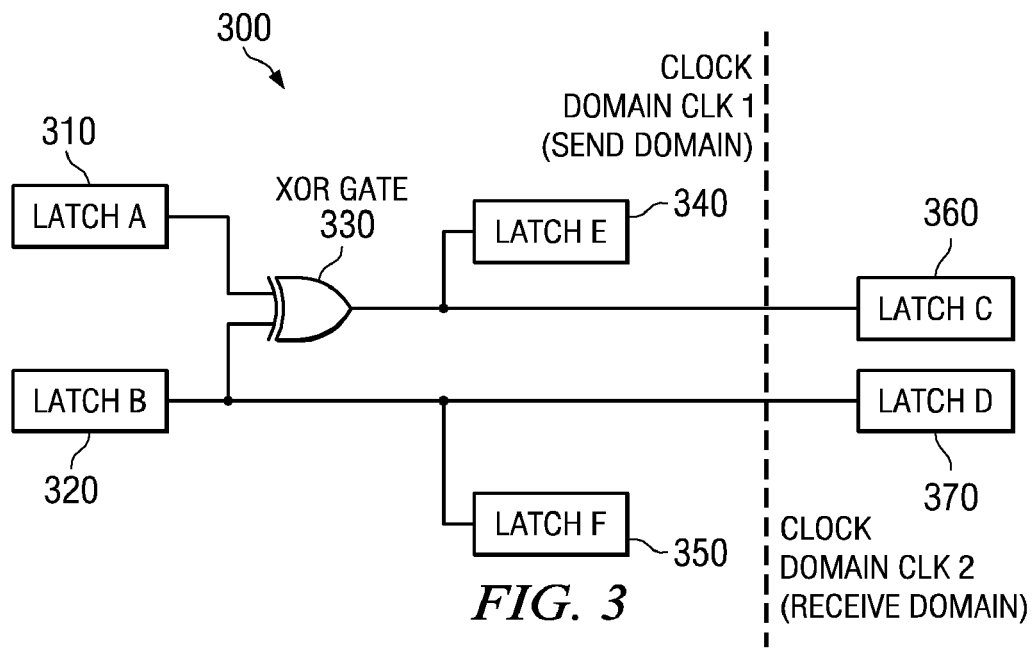
FIG. 3 is an exemplary diagram of an asynchronous crossing which may be modeled using the mechanisms of the illustrative embodiments.

To illustrate the introduction of glitch conditions due to the transformation of the integrated circuit model in accordance with one illustrative embodiment, consider the simple circuit model shown in FIG. 3. The model shown in FIG. 3 is shown as latches, a logic gate, and nets connecting the latches with the logic gate. It will be appreciated that the actual circuit model may be represented in a netlist that is equivalent to the depiction shown in FIG. 3. This netlist may be operated upon by the mechanisms of the illustrative embodiments to achieve the purpose of the present invention as described hereafter.

The circuit model 300 in FIG. 3 represents an asynchronous crossing in which latch A 310 and latch B 320 provide outputs that are input to the XOR gate 330, all within a first clock domain clk1. In addition, the output of latch B 320 is provided as an input to latch F 350 in the first clock domain clk1 and latch D 370 in a different clock domain clk2. The output of the XOR gate 330 is input to latch E 340 in clock domain 340 and latch C 360 which is in the different clock domain clk2. The asynchronous crossing from domain clk1 to domain clk2 may be modeled using the mechanisms of the illustrative embodiments by introducing logic into the model 300 for modeling the random selection of a phase difference between the clock driving the circuitry in domain clk1 and the clock driving the circuitry in domain clk2. This additional logic involves one or more multiplexers and latches for providing a plurality of possible latency choices for the clock of one or more of the clock domains clk1 and clk2. One of the possible latency choices is randomly selected for use in driving the clock of the particular corresponding clock domain clk1 or clk2. This models a randomly initialized phase difference between the clocks of the clock domains clk1 and clk2.

Moreover, the path from latches A 310 and B 320 to latch C 340 and from latch B 320 to latch D 370 may be replicated in a manner similar to that described in co-pending and commonly assigned U.S. patent application Ser. No. 11/054,903 entitled "System and Method for Unfolding/Replicating Logic Paths to Facilitate Propagation Delay Modeling," filed on Feb. 10, 2005, which is hereby incorporated by reference. Such path replication is only applicable when one wants to represent the same signal with different values. For asynchronous modeling, a path may be replicated if the same source signal re-converges at a sink point. For the example in FIG. 3, path replication is not necessarily applicable but may be applicable if the same source signal drives asynchronous as well as synchronous logic. In such a case, the common gates in the asynchronous and synchronous fanout will require path replication since one does not want to apply the asynchronous transform such that it will also affect the synchronous logic.

As described in the commonly assigned and co-pending U.S. patent application Ser. No. 11/054,903, the replication operation involves replicating the nets and logic in the netlist and connecting the nets and logic to a replicated source and replicated endpoints in a manner similar to the source and endpoints in the original logic. These new nets in the netlist may then be driven separately such that a different propagation delay and/or initial phase difference between clock domains along different nets from the same source may be simulated. In this way, a level of propagation delay and/or initial phase difference between clock domains may be abstracted into the modeling by driving or delaying each path separately. A transitioning value will then appear to have differing arrival times from the perspective of the sinks.

In operation, a new source net will be created for every path to be unfolded/replicated. The gates and nets (except the first net, connected to the start point) in a path are replicated for each unique endpoint, if not already replicated from a previous iteration of the unfolding/replication. If the replicated gate is the respective first gate in the path, then the newly created source net is connected to this replicated first gate accordingly. All the replicated gates and nets are connected in accordance with the original gates and nets, except that replicated nets are connected to the inputs and outputs of the replicated gate where possible. However, if a replicated net is not available for a gate input, then the gate input is connected to the original net. If a replicated net is not available for a gate output, then the gate output is left disconnected. Once the replicated path is created, the end point is then disconnected from its original source net and connected with the respective replicated net. This end point can now be uniquely driven by the new start point.

By replicating the gates and nets for each unique endpoint, it is possible for paths with a common endpoint to share replicated gates and nets. It is also possible for some connections (to non-replicated nets) of an already replicated gate to be replaced by replicated nets from subsequent/other replicated paths. It is also important to note that not all nets and gates in the cone of logic for an endpoint need be replicated. A net will only be replicated if it exists in a path to be unfolded, e.g., a net of a path having an asynchronous crossing.

An example of common logic which is replicated is A:=X AND Y and B:=X AND Y, where A, B, X, Y are all latches. In the original netlist, the same AND gate may drive both A and B. However, if A, X, and Y are in a common clock domain which is different from B, then the asynchronous pathways are X to B and Y to B. In this case, path replication is required to unfold the shared logic such that the asynchronous transform can be applied to only the asynchronous paths. The resulting netlist may have the original A:=X AND Y logic but also create an X' and Y' buffers. This can be done by, for example, using buffers X':=X and Y':=Y. The AND gate would also need to be replicated such that B:=X' AND Y'. The asynchronous transform (skew logic) is applied/inserted at X' and Y'.

In a circuit model 300 with the asynchronous behavior inserted using the mechanisms of the illustrative embodiment, i.e. randomly selected clock phase differences and separately driven replicated nets, it is possible for the input to latches C 340 and D 370 to experience a glitch condition, i.e. a temporary transition to a different value at one of the inputs due to a propagation delay or phase difference between clocks of an asynchronous crossing, thereby causing the input to the latches C 340 and D 370 to transition from 0 to 1 or vice versa. Whether a glitch is produced is dependent on the combinational logic involved and the source signals which are transitioning. The width of a glitch is dependent on the timing differences of the transitioning source signals which contribute to the combinational logic.

Glitches within synchronous logic can be ignored since static timing tools exist which will validate that these glitches will not be captured by downstream latches. Thus, in the circuit model 300 which does not include the additional asynchronous crossing logic of the illustrative embodiments, glitches are not experienced. However, within asynchronous crossings, and thus the asynchronous crossing logic introduced to the circuit model 300 by the mechanisms of the illustrative embodiments, glitches may be captured by an asynchronous endpoint since the paths in the asynchronous crossing are either not statically timed or the phase relationship between the source and sink clocks is not known.

Glitches within the original model 300 will not be possible unless some propagation delay modeling is performed from the contributing source latches A 310 and B 320 to the sink latches, e.g., latches C 340 and D 370, of the asynchronous crossings. In the depicted example, if the glitch can be captured by latch C 340 or latch D 370 in the transformed model, whereas it is not seen/producible in the original model 300, it is possible that this captured glitch can be amplified into a behavioral difference in the original model 300 and the transformed model. If captured glitches can become visible to the assertions being checked in the model 300, asynchronous verification will flag such problems whereas traditional synchronous verification will not.

In the above description of the illustrative embodiments, latch 340 is in the same clock domain as the source latches. Thus, although a glitch will occur in the physical design, the glitch will not be captured since it is synchronous with its source latches. As a result, skewing does not occur from the source latches 310 and 320 to latch 340 since it is not needed or desired. However, skewing does occur from latches 310 and 320 to latch 360. Skewing also occurs between latches 320 and 370.

Figure 4A:
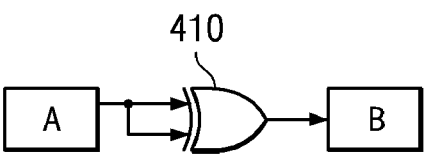
FIGS. 4A-4B illustrate an example of unfolding/replicating a logical XOR gate having two inputs from a single source in accordance one illustrative embodiment.
Figure 4B:
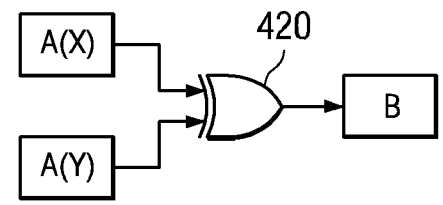

As mentioned above, in transforming the original model 300 into a model having logic for representing the asynchronous crossings, replication of paths across the asynchronous crossings is performed in a manner similar to that described in co-pending U.S. patent application Ser. No. 11/054,903. FIGS. 4A-4B illustrate an example of unfolding/replicating a logical XOR gate having two inputs from a single source in accordance the mechanism of U.S. patent application Ser. No. 11/054,903, the mechanisms of which may be used with those of the present invention. As shown in FIG. 4A, the inputs to XOR gate 410 are both driven by source A and the XOR gate 410 provides an output to sink B. In a traditional logic simulation of this circuit, the sink B will never see a glitch-to-1, i.e. a temporary transition to a different value at one of the inputs due to a propagation delay thereby causing the output of the XOR gate to be a 1. However, a glitch-to-1 is a real possibility in the actual circuit due to propagation delays and/or phase differences of clocks in clock domains of an asynchronous crossing.

With the illustrative embodiments, the circuit shown in FIG. 4A may be unfolded such that the glitch-to-1 condition is made possible in the logic simulation. That is, through the mechanisms of the illustrative embodiments, the XOR gate 410 shown in FIG. 4A is unfolded to generate the XOR gate 420 shown in FIG. 4B. As shown in FIG. 4B, the inputs to the XOR gate 420 are separately driven by sources A(x) and A(y) thereby permitting an independent delay in the transition of the value from sources A(x) and A(y). As a result, one input may transition faster than the other input causing a temporary glitch-to-1 condition to occur in the logic simulation.

Figure 5A:
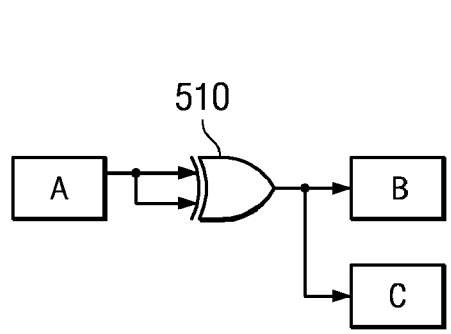
FIGS. 5A-5B illustrate an example of unfolding a logical XOR gate having two inputs from a single source and two output lines that are to be driven, in accordance with an exemplary embodiment of the illustrative embodiments.
Figure 5B:
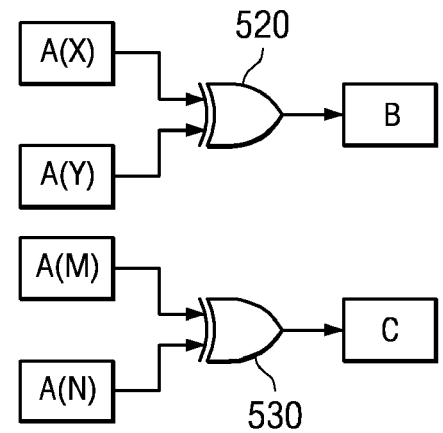

FIGS. 5A and 5B illustrate an example of unfolding a logical XOR gate having two inputs from a single source and two output lines that are to be driven, in accordance with an exemplary embodiment of the illustrative embodiments. As shown in FIG. 5A, the XOR gate 510 is similar to the XOR gate 410 in the previous example except that the output of the XOR gate 510 drives two sinks B and C. Since the XOR gate 510 drives two sinks B and C, in addition to unfolding the nets from the source A to provide separately driven inputs to the XOR gate 510, the XOR gate 510 itself must be replicated so that it may separately drive each of the outputs B and C.

FIG. 5B illustrates the unfolded/replicated XOR gates 520 and 530 according to the present invention. As shown in FIG.
5B, the inputs to XOR gate 520 are driven by sources A(x) and A(y) and XOR gate 520 provides an output to sink B. The inputs to XOR gate 530 are driven by sources A(m) and A(n) and the XOR gate 530 provides an output to sink C. The x, y, m and n values are all potentially different delay amounts.

Figure 6A:
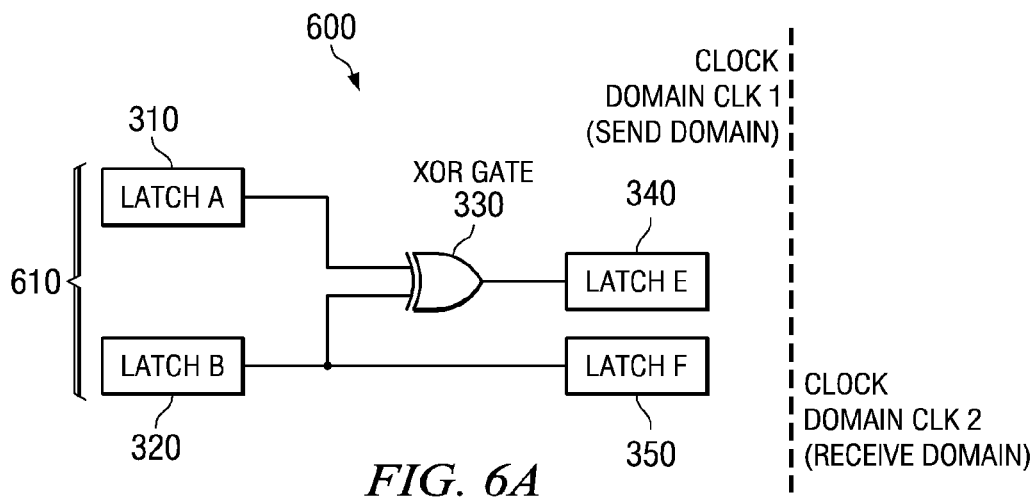
FIGS. 6A-6B is an exemplary diagram illustrating an unfolded/replicated version of the circuit design in FIG. 3 in accordance with one illustrative embodiment.
Figure 6B:
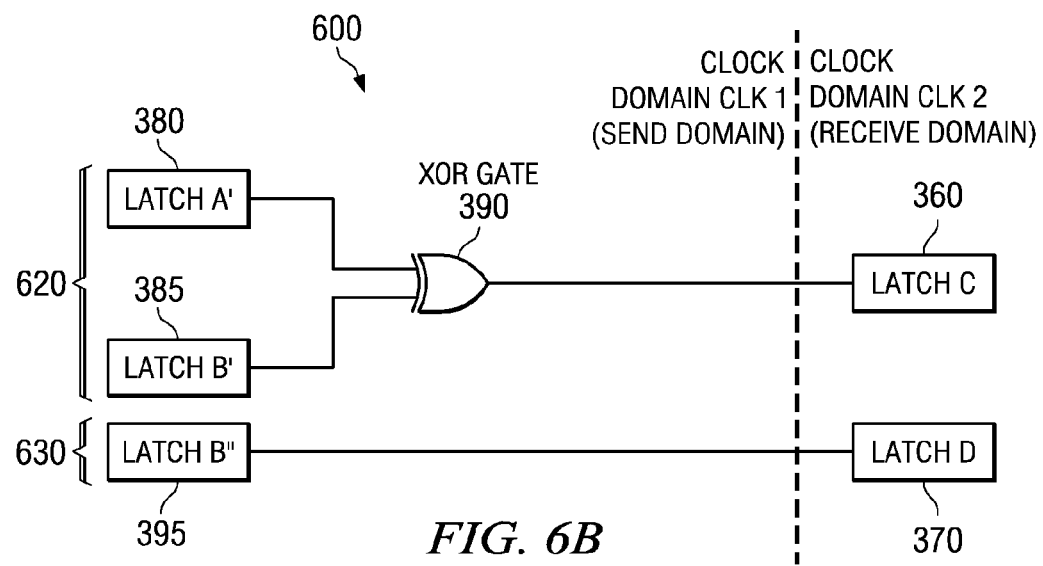

Using a mechanism such as that illustrated in FIGS. 4A-5B, the circuit model 300 in FIG. 3 may be unfolded/replicated to generate the circuit models 600 and 610 in FIGS. 6A and 6B. FIG. 6A represents the model 600 for only the synchronous logic in which the original pathways, gates, and source latches are utilized. FIG. 6B represents the model 610 for the asynchronous logic in which path replication as well as alternative (skewed) source values are utilized.

As shown in FIG. 6A, the circuit model 600 is essentially the set of nets that do not cross the asynchronous boundary between the first clock domain clk1 and the second clock domain clk2. Since there are no asynchronous considerations necessary with these nets, it is not necessary to unfold/replicate these nets further and standard synchronous behavior may be modeled using the model 600 of FIG. 6A.

In FIG. 6B, the asynchronous behavior of the original model 300 from FIG. 3 must be modeled using the nets 620 and 630. Because the sources may be skewed, i.e. the clock clk1 of the send domain may be offset from the clock clk2 of the receive domain, alternative source values may be utilized for the sources from latches A 310 and B 320 in the model 300 of FIG. 3. Thus, in the net 620, latch A' 380 is utilized along with latch B' 385. These latches A' 380 and B' 385 may or may not have a different clock skew from that of the original latches A 310 and B 320 with regard to latch C 360. Since latch A 310 and latch B 320 are in the same clock domain, their clocks are the same relative to each other. The phase difference between the two clock domains is relevant, but since latch A 310 and latch B 320 are in the same clock domain, the difference in propagation delays, i.e. the time difference from latch A 310 to latch C 360 and from latch B 320 to latch C 360 is relevant. A glitch may happen because of the clocks being asynchronous with regard to each other and also because of the propagation delay differences.

The net 620 further comprises a replicated XOR gate 390, corresponding to XOR gate 330 in the original model 300 of FIG. 3, and latch C 360 from the original model 300. Thus, the net 620 represents the possible asynchronous behavior of sources latch A' 380 and latch B' 385 relative to the sink latch C 360.

The net 630 represents the asynchronous behavior of the original model 300 from FIG. 3 between the source latch B 320 and the sink latch D 370. Again, because of this asynchronous behavior, in the resulting model the latch B 320 may be driven with a skewed send domain clock clk1 relative to the receive domain clock clk 2. Thus, in the net 630, latch B" 395 is utilized. Moreover, the skew of the clock for the source latch B" 395 in the net 630 may be different from that of the corresponding source latch B' 385 in the net 620. Thus, the net 630 represents the possible asynchronous behavior of the source latch B" 395 relative to the sink latch D 370. In this way, the original model 300 is unfolded into a model comprising three separate nets 610-630 that may be individually simulated, with logic replicated where necessary, that represent the synchronous and asynchronous behavior of the original model.

Figure 7:
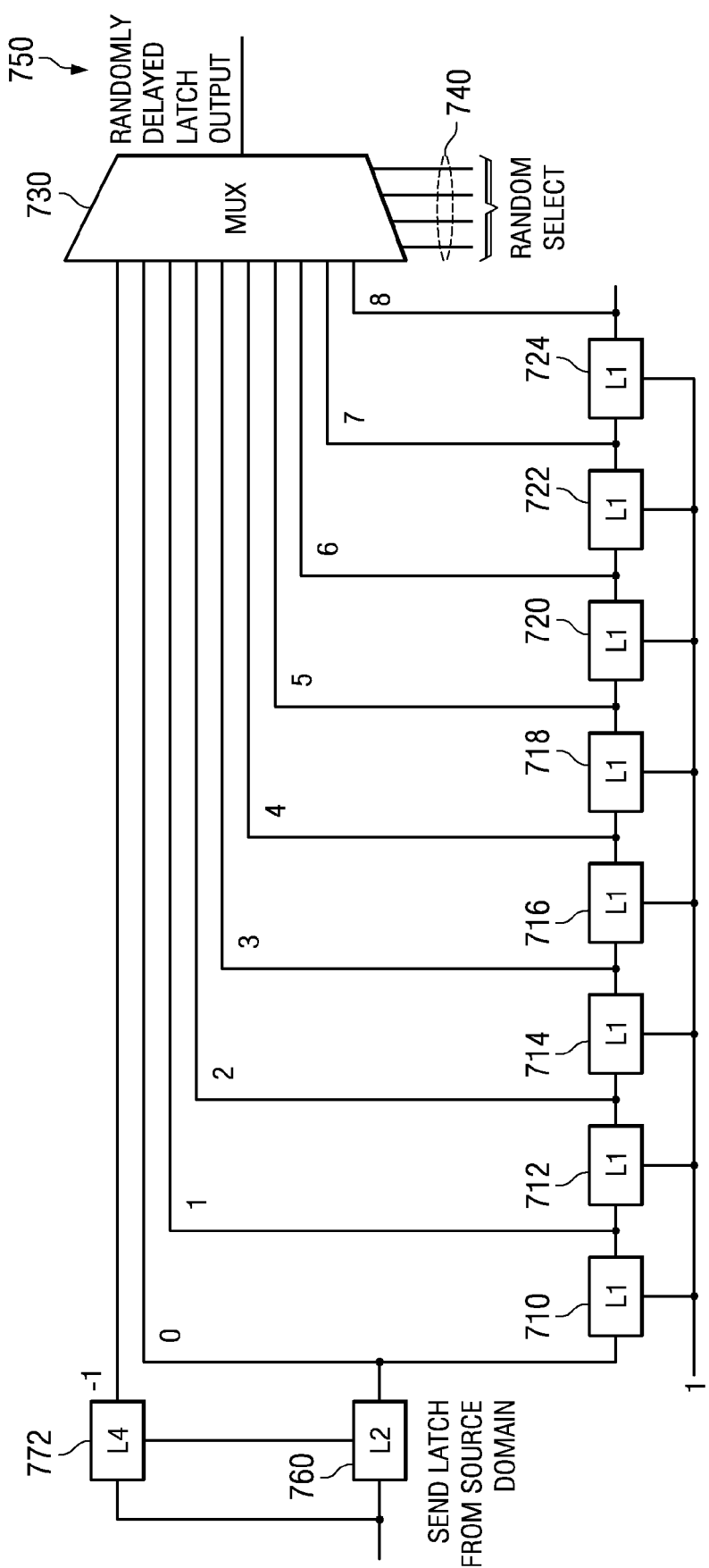
FIG. 7 is an exemplary diagram of logic that may be added to an integrated circuit design model to represent a randomly selected power of 2 number of possible phase differences between clocks of the asynchronous crossing.

FIG. 7 is an exemplary diagram of logic employed by the mechanisms of one illustrative embodiment for randomly selecting a phase difference between clocks of a send and a receive domain. The logic shown in FIG. 7 is used when presented with a power of 2 number of phase difference, or latency, choices. As shown in FIG. 7, a plurality of latency latches (L1) 710-724 are provided in series for introducing different latency possibility from which a latency or phase difference may be selected. The outputs of the latency latches 710-724 are coupled to a multiplexer 730 as inputs. The multiplexer 730 further has a plurality of select signal inputs 740, which may themselves be provided via a L4 latch (not shown), which are used to randomly select one of the inputs to the multiplexer 730 for output as the randomly delayed latch output 750.

Each latency latch 710-724 introduces an additional latency to the output of the value from the send latch (L2) 760 of the source clock domain, e.g., clock domain clk1 in FIGS. 3 and 6. The send latch 760 provides a non-delayed, or additional latency of 0, input to the multiplexer 730. Moreover, a latch (L4) 770 may be provided for providing a −1 latency input to the multiplexer 730. The nomenclature for modeling latches used in FIG. 7 represents transparent latches as "L4" latches, transparent meaning that there is no delay for updating and seeing a value reflected as the latch output. This is how the latch (L4) 770 is able to generate a −1 latency input to the multiplexer 730 which models early mode, i.e. when the source latch arrival time is within the hold time of the sink latch.

The select signal to the multiplexer 730 that is enabled is randomly selected in the analysis engine performing the analysis of the illustrative embodiments. Based on the random enablement of a select signal, a corresponding input to the multiplexer 730 is randomly selected for output as the source domain's output to the receive domain. In this way, the receive domain receives a randomly skewed output from the source domain thereby modeling a random phase difference between the source and receive clock domains clk1 and clk2.

As mentioned above, the logic shown in FIG. 7 is used when it is desirable to provide a power of 2 number of latency choices for modeling the phase difference between the send and receive clock domains. Binary logic, such as a multiplexer, is geared for selecting power of 2 choices. When one has non-power-of-2 choices, one cannot easily use a single multiplexer for obtaining an equally weighted random selection of the choices. Equal weighting is more important for non-formal techniques, such as simulation. Since the sequential equivalence checking of the illustrative embodiments is a formal/semi-formal technique, using a single multiplexer, as described above, is possible even when there are non-power-of-2 latency choices. One can simply "fill" the select data inputs with redundant latency choices if necessary. However, even with formal/semi-formal techniques, one may want to have even weighting such that the counter-examples produced are truly random.

Figure 8:
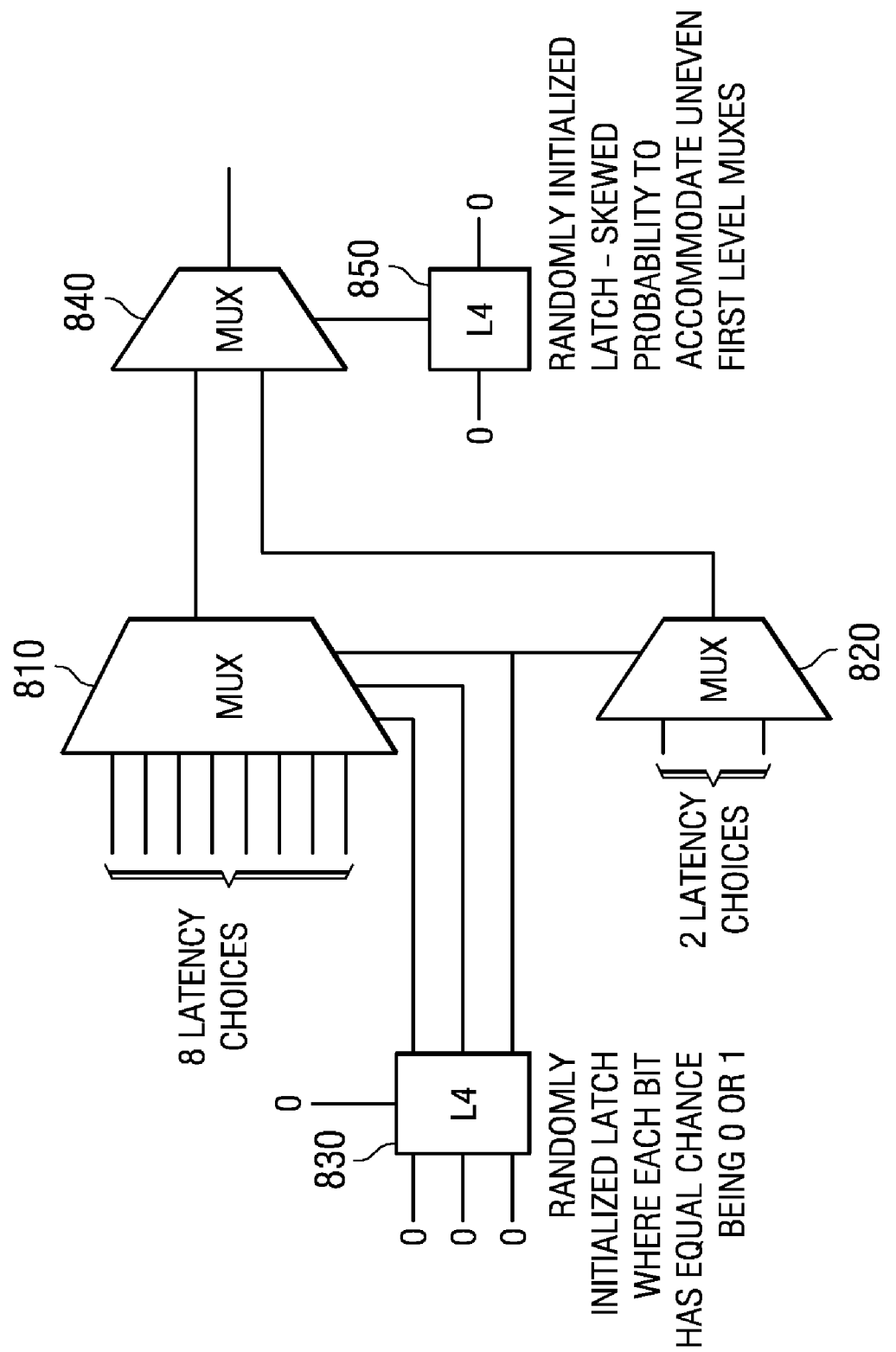
FIG. 8 is an exemplary diagram of logic that may be added to an integrated circuit design model to represent a randomly selected non-power of 2 number of possible phase differences between clocks of an asynchronous crossing.

For example, using the logic of FIG. 7, a minimum latency of −1 clock cycle and a maximum latency of 8 clock cycles is made possible. Thus, the number of possible delays in the logic of FIG. 7 is 10. If any other number of latency choices is desirable, i.e. a non-power of 2 number of latency choices, logic involving a cascade of multiplexers may be utilized, such as the example logic shown in FIG. 8. As shown in FIG. 8, a first multiplexer 810 is provided with 8 input latency choices and a second multiplexer 820 is provided with 2 other latency choices for a total of 10 latency choices. A first latch 830 provides select signals to the first multiplexer 810 and a select signal to the second multiplexer 820. The first latch 830 is a randomly initialized latch where each bit has an equal chance of being 0 or 1. The outputs of the multiplexers 810 and 820 are input to a third multiplexer 840. A second latch 850 provides a select signal to the third multiplexer 840 for selecting between the output of the first multiplexer 810 and the second multiplexer 820.

The second latch 850 is randomly initialized, optionally with a skewed probability to accommodate uneven first level multiplexers 810 and 820. What is meant by "uneven" first level multiplexers is that some illustrative embodiments, latency choices may be input to the multiplexers more than once to thereby increase the probability that those latency choices will be randomly selected. For example, if the latency between 5 and 10 clock cycles is of concern in the modeling, a total of 10 latches may still be required but only 6 latency choices must be used as the selection range for the multiplexer. Thus, the output of some latches may be input to the multiplexer multiple times to increase the probability that the latency choice is randomly selected. In the depicted example, what is meant by uneven is that the random choices of multiplexer 810 and multiplexer 820 are funneled to multiplexer 840. For all the latency choices to be equally weighted, one would need to weight the random selection of multiplexer 840 such that it has an 8 in 10 chance of selecting the choice of multiplexer 810 and a 2 in 10 chance of selecting the choice of multiplexer 820.

It will be appreciated that while a cascade of multiplexers is described above for use in providing a non-power of 2 number of latency choices, the illustrative embodiments are not limited to using such logic. To the contrary, in other illustrative embodiments, a single multiplexer may also be used to provide a non-power of 2 number of latency choices but the single multiplexer must be large enough to account for all the latency choices.

Thus, in the first operation of the illustrative embodiments, the paths in a circuit design that are associated with an asynchronous crossing are unfolded/replicated and logic is introduced into the model to provide for a randomly selected phase difference between the clock domains of the asynchronous crossing. Next, sequential equivalence checking is performed by the sequential equivalence analysis engine. Sequential equivalence checking is the process of demonstrating that two designs are input/output equivalent, i.e. if the same sequence of inputs is applied to both designs, the two designs produce the same output sequence.

Figure 9:
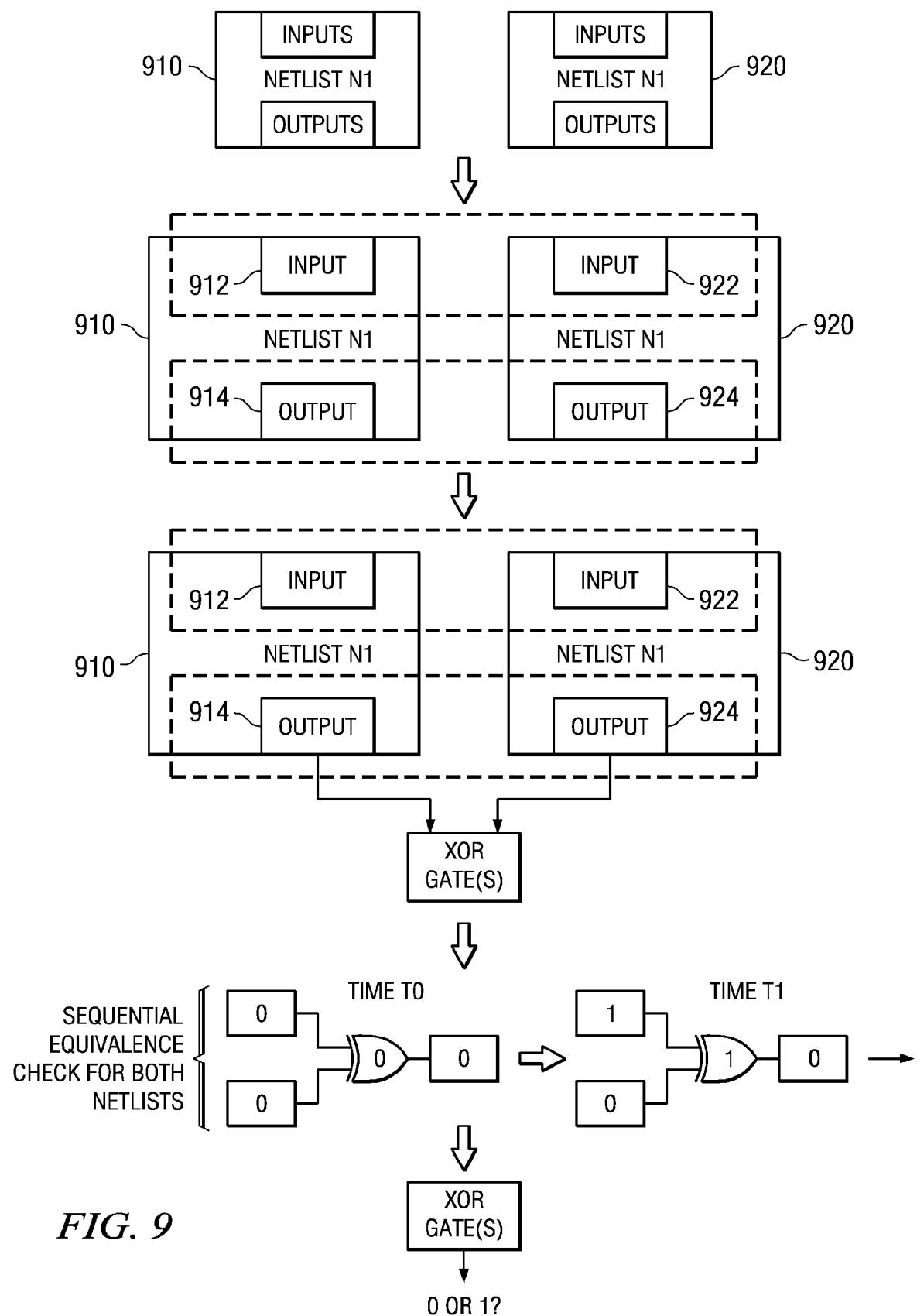
FIG. 9 is an exemplary block diagram illustrating an operation for performing sequential equivalence checking on a first model of an integrated circuit design and a second model of the integrated circuit design in which asynchronous crossing logic is provided in accordance with the illustrative embodiments.

FIG. 9 is an exemplary block diagram illustrating an operation for performing sequential equivalence checking on a first model of an integrated circuit design and a second model of the integrated circuit design in which asynchronous crossing logic is provided in accordance with the illustrative embodiments. As shown in FIG. 9, the first and second models 910 and 920 are provided as netlists N1 and N2, respectively. The inputs 912 and 922 of the netlists N1 and N2 are first correlated. That is, the inputs 912 and 922 to the netlists may have different names but may represent the same inputs. Such a situation may arise, for example, if the same HDL circuit representation is compiled by different compilers. Moreover, such a situation may arise where have the same logic is used, but at a different part of the design methodology, e.g., RTL vs. post-synthesis vs. circuit level, the names for the logic may be different.

In order to verify that, based on the same sequence of inputs, the same sequence of outputs are received, it is necessary to identify the inputs that are the same between the netlists N1 and N2. This may be done by way of any known correspondence operation that may be manual or automated in nature. I/O correspondence, for example, is usually performed by name with a regular expression substitution of names in one model to match the corresponding names in another model.

Similarly, the outputs 914 and 924 of the netlists N1 and N2 are also correlated in a similar manner. An XOR gate 930 is associated with correlated outputs of the netlists N1 and N2 such that the XOR gate 930 asserts an output only when the two inputs are different. In other words, if the output of the XOR gate 930 is asserted, then this indicates that the netlists N1 and N2 are not equivalent with regard to this output.

After correlating the inputs 912 and 922, correlating the outputs 914 and 924, and applying an XOR gate 930 to the correlated outputs 914 and 924, the netlists N1 and N2 are initialized and sequential redundancy algorithms are run to prove that the netlists N1 and N2 are sequentially equivalent. Examples of sequential redundancy algorithms 940 that may be used to prove that the netlists N1 and N2 are sequentially equivalent are described in co-pending and commonly assigned U.S. patent application Ser. No. 11/054,904, entitled "Exploiting Suspected Redundancy for Enhanced Design Verification," filed on Feb. 10, 2005. This co-pending and commonly assigned patent application describes a mechanism for removing redundancy in a design model, i.e. reducing the number of elements of the design model that exhibit identical behavior. Sequential redundancy algorithms operate on a sequential model of a circuit design to replace redundant elements with a single element. Such sequential redundancy removal algorithms may make use of inductive methods in which proposed equivalent elements are initialized to an arbitrary state in which each of the elements have the same value and the inductive method demonstrates that each of the elements remain equivalent one or more time steps from the initial state.

The mechanism described in commonly assigned and co-pending U.S. patent application Ser. No. 11/054,904 performs sequential redundancy removal by first identifying an equivalence class including a set of candidate gates suspected of exhibiting equivalent behavior. One of the candidate gates is identified as a representative gate for the equivalence class. Equivalence targets are added to the netlist by XORing each candidate gate with the representative gate. A speculatively reduced netlist is generated by inserting the representative gate as the source gate for edges sourced by a candidate gate in the original design. The speculatively reduced netlist is then used either to verify formally the equivalence of the gates by applying a plurality of transformation engines, e.g., retiming engine, localization engine, and a parametric re-encoding engine, to the speculatively reduced netlist or to perform incomplete search and, if not of the equivalence gates is asserted during the incomplete search, applying any verification results achieved with the incomplete search to the original model.

Thus, by using either the sequential redundancy mechanism described in co-pending and commonly assigned U.S. patent application Ser. No. 11/054,904 or another type of sequential redundancy mechanism or algorithm, it can be determined whether the candidate gates in the netlists N1 and N2 are sequentially equivalent. In making such a determination, it is determined whether all of the XOR gates, e.g., XOR gate 930, of the correlated outputs provide an output indicative of the XOR gates inputs being the same, i.e. that an assertion of an output by the XOR gate 930 is unreachable. If all of the XOR gates 930 indicate that their inputs are identical, then the two netlists N1 and N2 are sequentially equivalent. Thus, the asynchronous crossing in the circuit design is verified to operate properly and consistently.

If any of the XOR gates 930 applied to the correlated outputs 914 and 924 of the two netlists N1 and N2 indicate that their inputs are not the same, then two netlists N1 and N2 are not sequentially equivalent and thus, the asynchronous crossing may not be operating properly. Such a result occurs, for example, when captured glitches in the netlist N2 having the asynchronous crossing logic inserted therein, become visible at the primary outputs of the design (alternatively, sequential equivalence checking may also be applied to any user specified internal signal such that the sequential equivalence analysis engine monitors the user specified signals). These captured glitches are indicative of a possible asynchronous design problem that may cause functional problems.

It should be noted that the glitches produced by the asynchronous model transform, i.e. the model having asynchronous crossing logic inserted therein, may not necessarily be directly seen at the primary outputs under some circumstances. Instead, the difference in outputs compared to the non-skewed model may be due to, for example, a missed request due to a glitch being captured or an invalid address since a skewed bus value was captured (skewed bus values are discussed in greater detail hereafter). Moreover, non-glitch producing asynchronous crossings may present differences if a skewed value is captured.

The captured glitches/skewed values are not necessarily indicative of a design problem and thus, it is important to determine whether an actual real failure of the design is detected by the captured glitches or if a false failure is detected. A false failure occurs when the two models are identified to be not sequentially equivalent due to illegal input scenarios rather than due to an actual asynchronous design problem. In other words, a false failure refers to the condition where a mismatch, or non-equivalence result in the sequential equivalence checking, is deemed to be "not a real logic bug." For example, such a false failure may be detected in a situation where a primary output is directly downstream of an asynchronous crossing such that glitches can be exposed at the primary output, but logic downstream of the output in the real design would erase the glitch. False failures in such situations are the result of the asynchronous modeling delays inserted into the asynchronous model Thus, it is important that failures indicated by the mismatch or non-equivalence result of the sequential equivalence checking of the illustrative embodiments be analyzed and classified by either an automated tool or a manual process of a user to determine if the failure is a real failure due to a problem in the asynchronous design or a false failure due to illegal input scenarios. For example, time-skewed fails due to differences in timing may be automatically filtered out by time skewing counter-example signals (within a range) known to be affected by asynchronous delays.

In order to reduce the likelihood that a detected mismatch or non-equivalence between the two models is due to a false failure, the sequential equivalence checking may be configured to operate under conditions that greatly minimize the sources of false failures. For example, the input valuations of the models may be constrained to avoid "uninteresting" mismatches. For example, often it is desirable to check sequential equivalence only across the functional mode of the circuit design. Thus, initialization logic may be disabled and functional clocking may be established during sequential equivalence checking, e.g., to prevent mismatches due merely to differing scan chain lengths. Other examples include cases where a design was optimized against an illegal input valuation, e.g., an invalid opcode. Such valuations may be disallowed to avoid uninteresting mismatches. Such input constraints are conservative given the stimulus the circuit design is subjected to during functional operation.

Additionally, direct comparison of outputs may yield uninteresting mismatches in some cases even if input constraining is performed. For example, a redesign may add a pipeline stage to a design. Without accounting for this latency difference, output mismatches would be inevitable. As another example, one may optimize the circuit design such that certain outputs may behave differently during "don't-care" time frames. One may thus, need to restrict the sequential equivalence checking to "care" time frames.

To avoid false failures, it has been determined that the sequential equivalence checking between the circuit models with and without the additional asynchronous crossing logic, certain constraints may be added to rule out these uninteresting mismatches. First, when checking functional equivalence, scan clocks and other testing modes, such as built-in self test (BIST), are turned off due to the reasons mentioned above. Alternatively, functional mode may be turned off when checking asynchronous crossings in the scan path. Thus, it has been determined that BIST versus non-BIST equivalence checks need to be performed independently. Thus, the sequential equivalence checking of the mechanisms of the illustrative embodiments may be applied twice, i.e. once with BIST and other testing modes turned off and functional mode turned on, and once with functional mode turned off and BIST/other testing modes turned on.

Second, the relative frequencies of the different clocks in the circuit design may be modeled during the sequential equivalence checking. This ensures that the clocks correctly relate to the skew/propagation delay inserted in the unfolding/replication and asynchronous crossing logic insertion operations described above. This allows the sequential equivalence checking to be exhaustive with respect to the phase differences between the clocks while avoiding redundant checks. The propagation delay inserted has a minimum and maximum latency that may be derived from the relationships between the clocks or the physical characteristics of the asynchronous crossing, such as wire length or the like. When performing the sequential equivalence check, the relationships between the clock frequencies between the send and received clock domains may be modeled so as to capture the effect of the skew—the minimum phase difference between the clocks should be within the range of the skews ensuring that it has the desired impact at the crossing boundary. This relationship can be captured by creating an oscillator which serves as the "base" clock, and deriving the different clocks from this base clock by suitably delaying them and setting up the right duty cycle.

Thus, with the mechanisms of the illustrative embodiments, rather than requiring functional verification to be performed on the asynchronous modeled design, the mechanisms of the illustrative embodiments use the sequential equivalence checking to prove that the two designs, i.e. the original design and the design with asynchronous logic inserted to model the asynchronous crossings, are input/output equivalent or to find behavioral mismatches if they are not. The sequential equivalence checking being performed across the asynchronous and non-asynchronous models exhaustively demonstrates that no mismatches may occur. Furthermore, such sequential equivalence checking guarantees that any functional verification performed on the non-asynchronous model implicitly carries over to the asynchronous model without a need to re-run those resources. This can save significant computation effort given a high performance sequential equivalence checker. Due to the computational difficulty of sequential equivalence checking, historically such applications were deemed out of the reach of asynchronous verification. Asynchronous verification typically is performed on design slices that comprise multiple clock domains. However, with the mechanisms of the illustrative embodiments, the unfolding/replication, redundancy checking, and sequential equivalence checking can be readily scaled to asynchronous verification.

Figure 10:
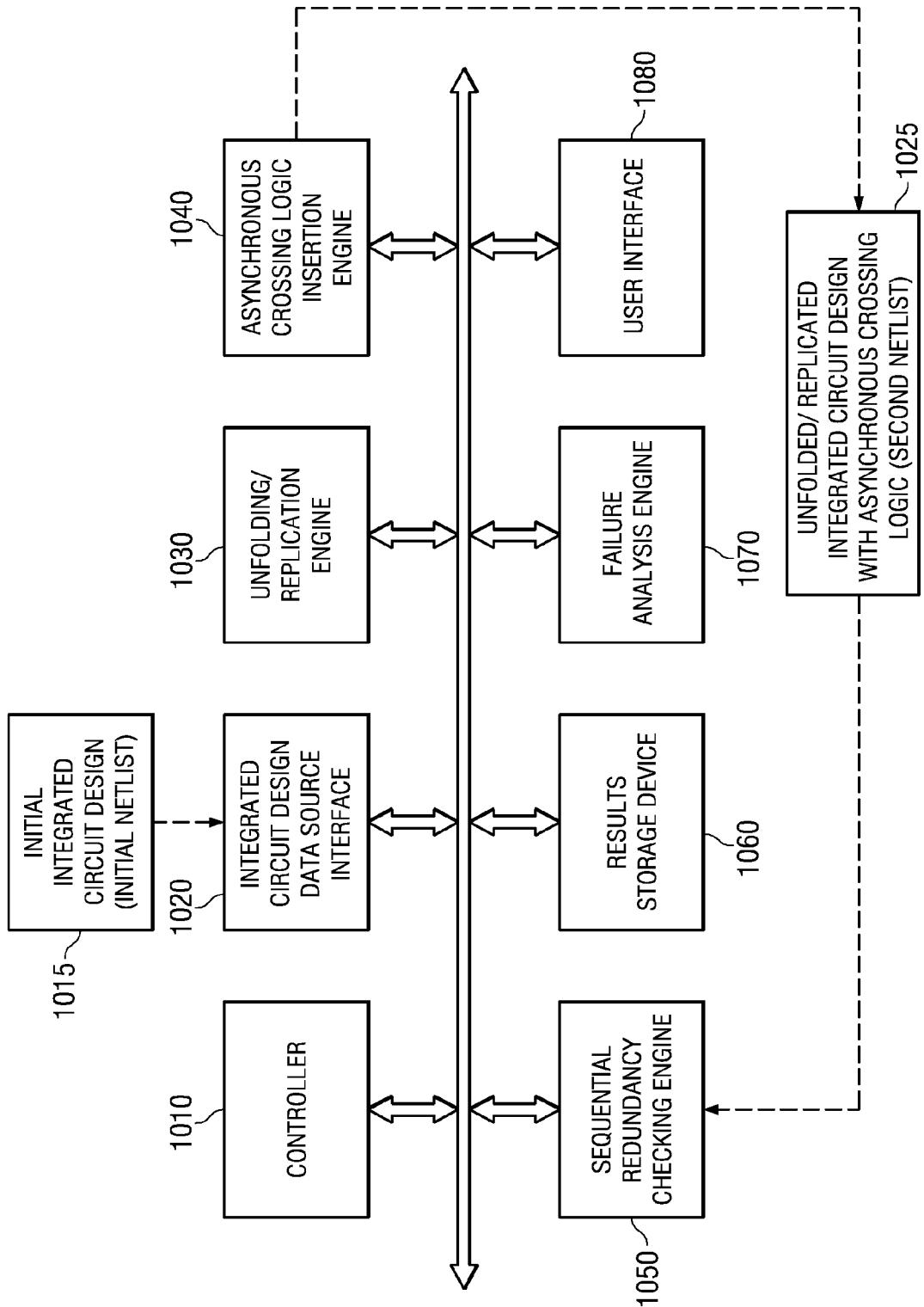
FIG. 10 is an exemplary block diagram of a sequential equivalence analysis engine in accordance with one illustrative embodiment.

FIG. 10 is an exemplary block diagram of a sequential equivalence analysis engine in accordance with one illustrative embodiment. As shown in FIG. 10, the primary operational components of the depicted illustrative embodiment include a controller 1010, an integrated circuit design data source interface 1020, an unfolding/replication engine 1030, an asynchronous crossing logic insertion engine 1040, a sequential redundancy checking engine 1050, a results storage device 1060, a failure analysis engine 1070, and a user interface 1080. These elements 1010-1080 may be part of, for example, an integrated circuit design system, many examples of which are generally known in the art. Thus, the elements 1010-1080 may be implemented in hardware, software, or any combination of hardware and software. In one illustrative embodiment, the elements 1010-1080 are implemented as software instructions executed by one or more processors of a data processing system. For example, the elements 1010-1080 may be implemented in a server data processing system, such as server 104 of FIG. 1.

The controller 1010 controls the overall operation of the sequential equivalence analysis engine 1000 and orchestrates the operation of the other elements 1020-1080. The integrated circuit design data source interface 1020 provides a communication interface through which an original integrated circuit design is received. The integrated circuit design may be received from a separate data processing device, such as a client data processing device or the like, or may be received via user input or input from a peripheral device, e.g., a CD in a CD-ROM drive or the like, coupled to the data processing device upon which the sequential equivalence analysis engine 1000 is implemented. The integrated circuit design may be provided in the form of a hardware description language (HDL) file, a netlist, or the like, as is generally known in the art. In the depicted example, the integrated circuit design is provided to the integrated circuit design data source interface as an initial netlist 1015.

The controller 1010 provides the initial netlist 1015 to the unfolding/replication engine 1030 which performs unfolding/replication of nets in the netlist 1015 for asynchronous crossings in the initial netlist 1015. The presence of asynchronous crossings can be identified by analysis of clock domains performed by the mechanisms that perform the asynchronous transformation (unfolding, replicating, skew insertion) or may be identified by an external mechanism, such as another data structure or the like identifying the asynchronous crossings are several ways asynchronous crossings can be identified. The unfolded/replicated netlist is then provided to the asynchronous crossing logic insertion engine 1040 which inserts logic for randomly selecting the phase difference between clocks of the clock domains of the asynchronous crossing. This results in a second netlist 1025 having logic inserted therein for modeling the asynchronous crossing.

The initial netlist 1015 and second netlist 1025 are provided to the sequential redundancy checking engine 1050 which correlates inputs of the initial netlist 1015 with inputs of the second netlist 1025, correlates outputs of the initial netlist 1015 with outputs of the second netlist 1025, and applies one or more XOR gates to the correlated outputs of the initial netlist 1015 and second netlist 1025. The sequential redundancy checking engine 1050 then performs a sequential redundancy process on the correlated initial and second netlists 1015 and 1025 and determines if any of the XOR gates assert an output. The outputs of the XOR gates may be recorded in the results storage device 1060 and may be output for use by a designer/engineer via the user interface 1080. If none of the XOR gates assert an output, the two netlists 1015 and 1025 are determined to be sequentially equivalent and thus, the asynchronous crossings in the circuit design operate properly and consistently, i.e. there are no errors in the circuit design with regard to the asynchronous crossings. Such a result may be recorded in the results storage device 1060 and may be output via the user interface 1080 to inform a designer/engineer of the proper design of the asynchronous crossings in the circuit design.

If any of the XOR gates assert an output, then it is determined that the two netlists 1015 and 1025 are not sequentially equivalent and thus, an asynchronous design problem may be present. Again, this result may be recorded and/or output for use by a designer or engineer. In this way, the designer/engineer is informed of the particular outputs that indicate a mismatch and thus, the designer/engineer's attention is directed to the particular area of the integrated circuit design where an asynchronous designer error may be present.

In the event that an XOR gate asserts an output, the asynchronous crossing corresponding to the XOR gate that asserts the output is analyzed to determine if the mismatch of the inputs to the XOR gate, i.e. the design failure, is a real failure or is a false failure. This analysis may be done manually or via an automated tool such as the failure analysis engine 1070. The failure analysis engine 1070 may generate an output indicative of whether the failure is a real failure and thus, the integrated circuit design needs to be modified, or that the failure is a false failure and the sequential equivalence checking needs to be modified to avoid "uninteresting" failure indications, as discussed above. Such outputs may be recorded in the results storage device 1060 and/or output via the user interface 1080.

Figure 11:
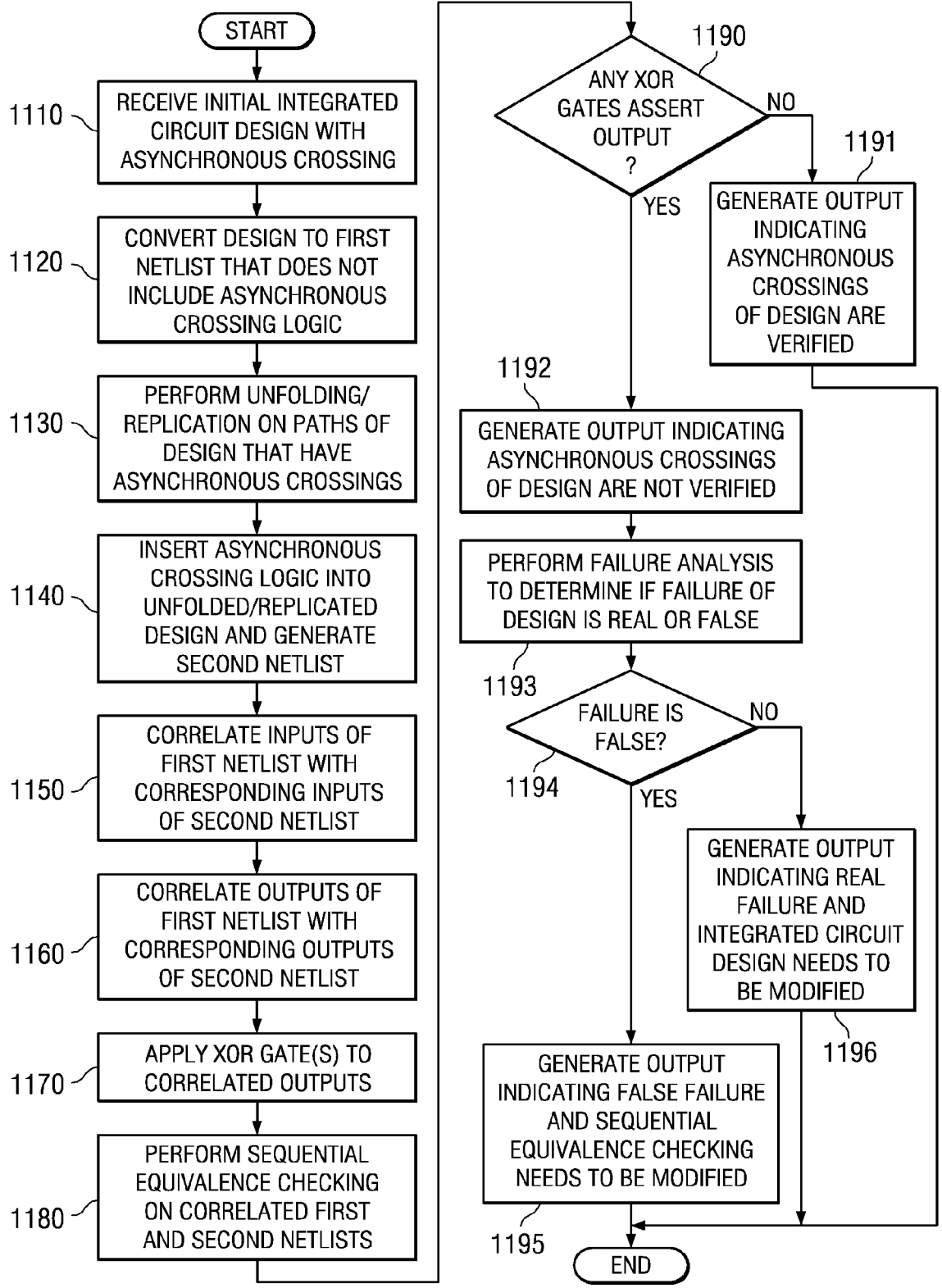
FIG. 11 is a flowchart outlining an exemplary operation for performing asynchronous verification of an integrated circuit design using sequential equivalence checking in accordance with one illustrative embodiment.

FIG. 11 is a flowchart outlining an exemplary operation for performing asynchronous verification of an integrated circuit design using sequential equivalence checking in accordance with one illustrative embodiment. It will be understood that each block of the flowchart illustration, flowchart illustrations provided thereafter, and combinations of blocks in the flowchart illustration(s), can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration(s) support combinations of means for performing the specified functions, combinations of steps for performing the specified functions and program instruction means for performing the specified functions. It will also be understood that each block of the flowchart illustration(s), and combinations of blocks in the flowchart illustration(s), can be implemented by special purpose hardware-based computer systems which perform the specified functions or steps, or by combinations of special purpose hardware and computer instructions.

Furthermore, the flowchart(s) are provided to demonstrate the operations performed within the illustrative embodiments. The flowchart(s) are not meant to state or imply limitations with regard to the specific operations or, more particularly, the order of the operations. The operations of the flowchart(s) may be modified to suit a particular implementation without departing from the spirit and scope of the present invention.

As shown in FIG. 11, the operation starts with receiving a initial integrated circuit design having one or more asynchronous crossings (step 1110). The initial integrated circuit design is converted to a first netlist that does not include asynchronous crossing logic for modeling the asynchronous crossings (step 1120). Unfolding/replication of the paths in the initial integrated circuit design that have asynchronous crossings is performed (step 1130). Asynchronous crossing logic is inserted into the unfolded/replicated initial integrated circuit design to thereby generate a second netlist having asynchronous crossing logic for modeling the asynchronous crossings (step 1140). This asynchronous crossing logic may comprise the skewing logic of FIG. 7 or FIG. 8, for example, for randomly selecting a phase difference between clocks of the asynchronous domains.

Inputs of the first netlist and second netlist are correlated (step 1150). Outputs of the first netlist and second netlist are correlated (step 1160). XOR gates are applied to the correlated outputs of the first and second netlists (step 1170). Sequential equivalence checking is performed on the correlated first and second netlists (step 1180).

A determination is made as to whether any of the XOR gates assert an output (step 1190). If not, then an output is generated indicating that the asynchronous crossings of the integrated circuit design are verified to operate correctly and consistently (step 1191). If any of the XOR gates assert an output (step 1190), then an output is generated indicating that the asynchronous crossings of the integrated circuit design are not operating correctly or consistently (step 1192). Failure analysis may then be performed on the paths in the netlists associated with the XOR gate(s) that asserted an output (step 1193) to determine if the failure of the design is a real failure or a false failure (step 1194). If the failure is a false failure, an output is generated indicating that the failure was false and that the sequential equivalence checking needs to be modified to eliminate unwanted failure indications (step 1195). If the failure is a real failure due to the integrated circuit design, then an output is generated indicating that the failure is a real failure and that the integrated circuit design needs to be modified (step 1196). These outputs may identify the particular portion of the netlists that need to be modified to avoid such failures. The operation then terminates.

As discussed above, the mechanisms of the illustrative embodiments allow sequential equivalence checking for asynchronous verification of integrated circuit designs. These mechanisms of the illustrative embodiments may be applied to a number of different types of integrated circuit designs. With regard to data bus designs, however, additional considerations may be required to account for delays on each individual strand of a data bus, i.e. each individual bit of a data bus. That is, the mechanisms of the illustrative embodiments above may be implemented for each individual strand of a data bus such that each strand has its own skew logic (as shown in FIG. 7 or 8, depending on whether a power-of-2 or non-power-of-2 number of choices are required). However, in addition to the skew within a single strand, the asynchronous problems associated with non-uniform arrival times of the bus strands must also be accounted for. A "bus" as the term is used herein means any group of data which should be viewed as having a same "logical" arrival time.

Taking an example in which the strands of the bus have skew logic such as that shown in FIG. 8, each of the skew logic of the various strands has random select inputs from L4 latches 830 and 850 to the multiplexers 810 and 840, respectively. The delay choices for this skew logic, e.g., the inputs −1 to 8 in FIG. 7 or the 8 latency choices in FIG. 8, may be used to identify a transitioning bit with a slowest delay for each selected asynchronous data bus. From this, a transition detection signal may be generated for selecting a slowest delay input to the multiplexers 810 and 840. This transition detection signal, along with the random select lines 830 and 850, may further be used to determine a representative delay select signal to use for the corresponding bus strand based on a transition detection signal that identifies whether a bit associated with the bus strand is transitioning or not. The resulting representative delay select signals for each strand may be used to determine a maximum delay of the bus for transitioning bus strands. The maximum delay of the bus for transitioning bus strands (0:n) may be used to drive the delay amounts for each bus strand (0:n) in place of the random select L4 latches of FIG. 8, or the random select inputs 740 of FIG. 7 if a power-of-2 number of choices is used, in one model while another model uses the randomly initialized and static delay amounts (provided by the random select L4 latches 830 and 850 in FIG. 8). The corresponding L4 latches of both models are initialized to the same values.

Figure 12:
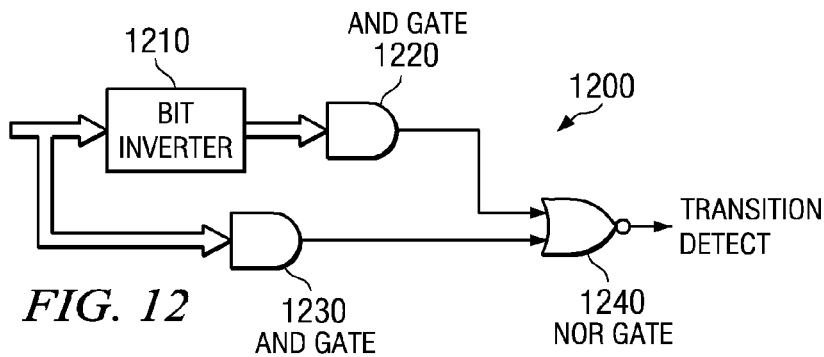
FIG. 12 is an exemplary diagram of logic for identifying whether a corresponding bus strand is transitioning in accordance with one illustrative embodiment.

For each strand of a bus, logic is provided for determining if the delay choice inputs to the skew logic indicate that the strand is transitioning. Example logic for identifying whether a corresponding strand is transitioning is shown in FIG. 12. As shown in FIG. 12, the exemplary logic comprises a bit inverter 1210, AND gates 1220 and 1230, and NOR gate 1240. The bit inverter 1210 and AND gate 1220 receive as input the delay choice signals of a bus strand's skew logic, e.g., the input signals provided by L1's 710-724 and L4 772 in FIG. 7 or the 8 latency choice inputs to multiplexer 810 in FIG. 8. The AND gate 1220 asserts an output to the NOR gate 1240 if all of the inputs from the skew logic have the same logic state. The bit inverted 1210 inverts the values of the bit inputs of the delay choices. The AND gate 1230 asserts an output to the NOR gate 1240 when the inputs to the AND gate 1230 all have the same logical state.

As a result of the inputs to the NOR gate 1240 from the AND gates 1220 and 1230, the output of the NOR gate 1240 is a logic high state, or 1, when the values for the delay choices are not uniform indicating that a transition exists for a particular strand. The output of the NOR gate 1240 may be provided as a transition detect signal to further logic for selecting a representative delay for the bus strand. It should be appreciated that this logic 1200 in FIG. 12 may be provided for each strand of a bus such that there may be multiple instances of the logic 1200 in FIG. 12 in a single circuit model.

It should be appreciated that while the particular arrangement of logic elements 1210-1240 is shown in FIG. 12 as one example implementation, other logic for identifying a transitioning bit with a slowest delay for a data bus may be used without departing from the spirit and scope of the illustrative embodiments. Moreover, it should be appreciated that more complex logic may be needed if it is possible for the delay choices to accommodate more than one transition, for example. However, this more complex logic will be readily apparent to those of ordinary skill in the art in view of the description set forth herein of the illustrative embodiments.

Figure 13:
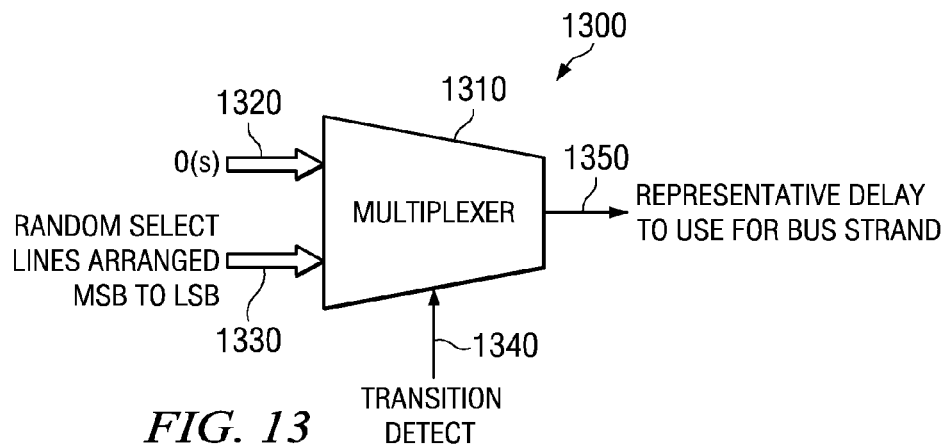
FIG. 13 is an exemplary diagram illustrating logic for identifying a representative delay to use for a bus strand in accordance with one illustrative embodiment.

FIG. 13 is an exemplary diagram illustrating logic of a circuit 1300 for identifying a representative delay to use for a bus strand in accordance with one illustrative embodiment. As shown in FIG. 13, the circuit 1300 includes a multiplexer 1310 that receives as inputs a 0 input 1320 and the random select L4 latch inputs 1330 for that bus strand. A transition detection signal input 1340 is provided to the multiplexer 1310. This transition detect signal input 1340 may be the output of the NOR gate 1240 of the logic 1200 in FIG. 12 for this same bus strand.

Based on the setting of the transition detect signal input 1340, one of the inputs, either the 0 input 1320 or one of the random select inputs 1330 may be selected for output as the representative delay select signal to use for the bus strand 1350. If the transition detect signal is set to a 1, then the random select input 1330 selected for this strand is selected for output as the representative delay select signal for the bus strand 1350. If the transition detect signal is set to a 0, then the 0 input 1320 is selected for output as the representative delay select signal for the bus strand 1350.

Thus, the logic 1200 in FIG. 12 is used to detect a transitioning bit in the bus strand and the logic 1300 in FIG. 13 is used to select a representative delay for the bus strand based on results of the detection of the transitioning bit. As with the logic 1200 in FIG. 12, there may be an instance of the logic 1300 in FIG. 13 for each bus strand such that multiple representative delay outputs are generated, one for each bus strand. These representative delay outputs may be compared with each other to determine a maximum delay for transitioning bits. That is, for those strands that do not have a transitioning bit, the output of the logic 1300 is the 0 1320 input as the representative delay 1350. For strands that have a transitioning bit, the output of the logic 1300 is one of the random select signals 1330. Thus, by comparing the outputs 1350 of each strand to each other, the maximum randomly selected delay for strands having transitioning bits may be identified.

Figure 14:
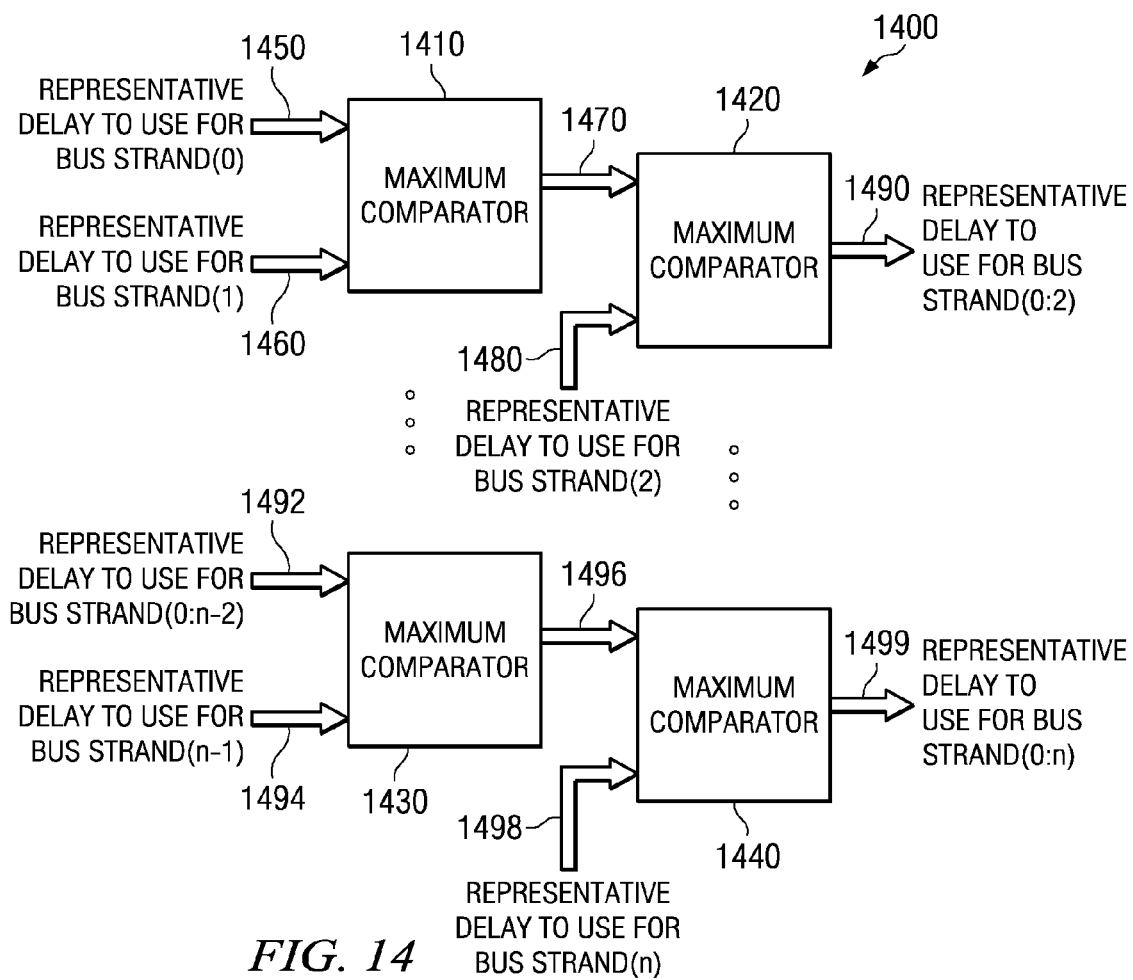
FIG. 14 is an exemplary diagram of logic which may be used to determine a maximum delay for transitioning bits of a bus in accordance with one illustrative embodiment.

FIG. 14 is an exemplary diagram of logic which may be used to determine a maximum delay for transitioning bits of a bus in accordance with one illustrative embodiment. As shown in FIG. 14, the logic 1400 comprises a plurality of maximum comparator logic blocks 1410-1440. The maximum comparator logic block 1410 compares the representative delay output signals of bus strands 0 and 1, i.e. inputs 1450 and 1460. The output of the maximum comparator logic block 1410 is the input 1450 or 1460 that has the larger delay value. This output 1470 is then input to a second maximum comparator logic block 1420 which compares the maximum delay value output 1470 with a next bus strand, i.e. bus strand 2, representative delay value output signal 1480 with the result being the input with the greater delay value being output as the maximum delay value for bus strands 0:2 1490. This cascaded maximum comparator logic may continue through logic blocks 1430-1440 until all n bus strands are compared to identify the maximum delay value for all of the bus strands 0:n.

As shown, the maximum comparator logic block 1430 receives the maximum delay for transitioning bus strands (0:n−2) 1492 and the representative delay for use for bus strand (n−1) 1494. The maximum comparator logic block 1430 outputs the input 1492 or 1494 having the larger delay value 1496 to the maximum comparator logic block 1440 which compares it to the representative delay to use for bus strand (n) 1498. The input 1496 or 1498 that has the larger delay value is then output as the maximum delay for transitioning bus strands (0:n) 1499.

The maximum delay for transitioning bus strands (0:n) 1499 is used to drive the delay amounts for each bus strand (0:n), in place of the random select inputs from L4 latches of FIG. 7 or 8, in one circuit model, e.g., circuit model 910 in FIG. 9, while the other model, e.g., circuit model 920 in FIG. 9, uses the randomly initialized and static delay amounts provided by the random select L4 latches. The corresponding L4 latches of both models 910 and 920 are initialized to the same values. Sequential equivalence checking may then be performed in a similar manner as discussed above.

Figure 15:
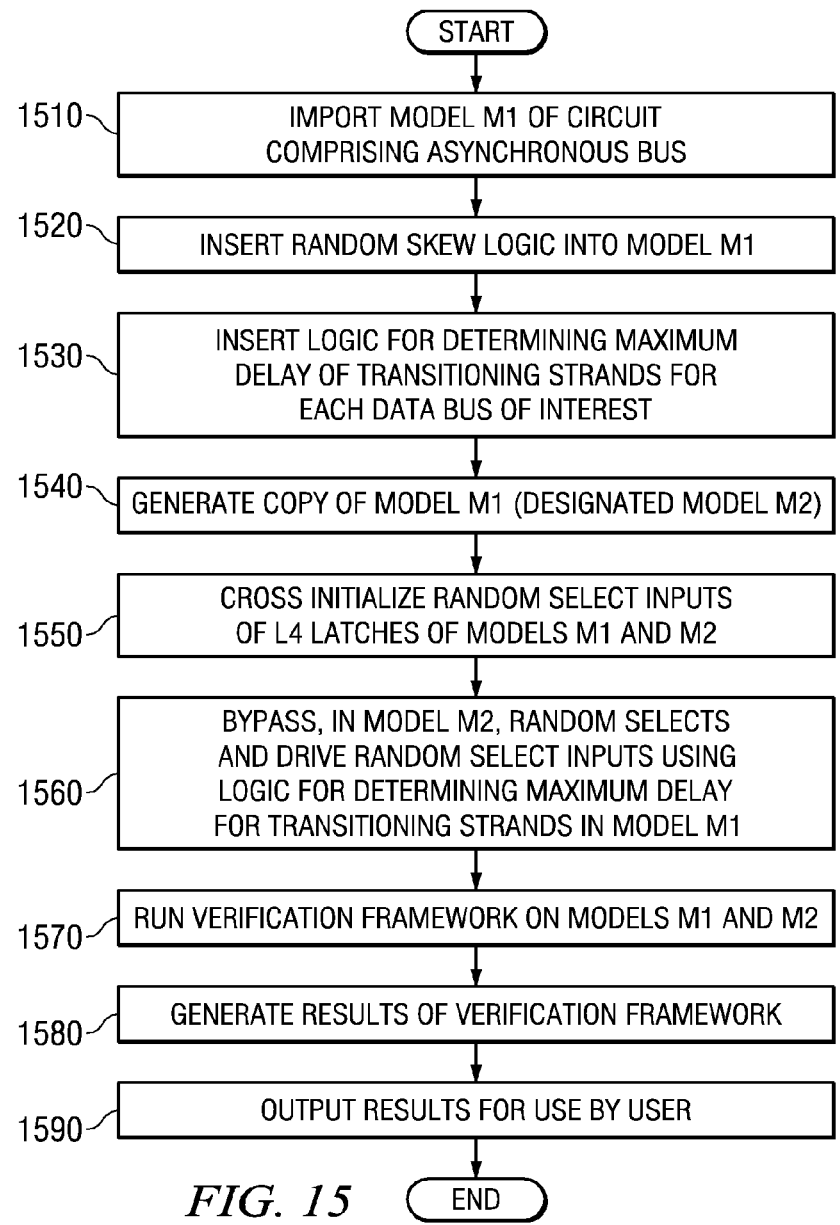
FIG. 15 is a flowchart outlining an exemplary operation for verifying asynchronous buses using sequential equivalence checking in accordance with one illustrative embodiment.

FIG. 15 is a flowchart outlining an exemplary operation for verifying asynchronous buses using sequential equivalence checking in accordance with one illustrative embodiment. As shown in FIG. 15, the operation starts with importing a model (referred to herein as M1) of a circuit comprising an asynchronous bus to be asynchronously tested (step 1510). Random skew logic is inserted into the model (step 1520). For example, logic such as shown in FIG. 7 or 8 may be inserted into the model in appropriate locations where asynchronous boundaries may be present, for randomly skewing the clocking signals. As discussed above, with regard to an asynchronous bus, this may require that such logic be provided for each bus strand.

For each data bus, logic for determining the maximum delay of transitioning strands is inserted into the model (step 1530). For example, this logic may be similar to that described above with regard to FIGS. 12-14.

A copy of them circuit model (referred to herein as M2) is generated (step 1540). Random select inputs of L4 latches of the models M1 and M2 are cross initialized (step 1550). Then, for each of the data buses, the random select L4 latches in the M2 model are bypassed such that the random selects of the L4 latches are driven with corresponding logic for determining the maximum delay for transitioning strands (inserted in step 1530) of the M1 model for that particular bus (step 1560). A verification framework is then run to check the consistency of the models M1 and M2 (step 1570). This verification framework may include simulation, emulation, or formal equivalence checking of the join model containing the M1 and M2 models. A result of the verification framework may be generated (step 1580) and output to a user, such as via a display of a computer workstation, a hard copy print-out, or any other means for outputting information from a computing device (step 1590). This result indicates whether the model is verified or not and whether additional design modifications are necessary. The operation then terminates.

The mechanisms of the illustrative embodiments described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-recordable medium providing program code for use by or in connection with a computer or any instruction execution system. For the purposes of this description, a computer-usable or computer-recordable medium can be any apparatus that can contain or store the program for use by or in connection with the instruction execution system, apparatus, or device.

The medium may be, for example, an electronic, magnetic, optical, electromagnetic, infrared, or semiconductor system (or apparatus or device). Examples of a computer-recordable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for performing asynchronous verification of an integrated circuit design, comprising:

receiving a first model of the integrated circuit design;

unfolding paths within the first model that have asynchronous crossings to generate an unfolded integrated circuit design model;

inserting asynchronous crossing logic into the unfolded integrated circuit design model to generate a second model;

correlating outputs of the first model with outputs of the second model;

applying one or more exclusive OR operations to the correlated outputs of the first model and the second model; and performing, by the data processing system, sequential equivalence checking on the first model and second model utilizing the applied one or more exclusive OR operations, wherein the asynchronous crossing logic comprises skewing logic for selecting a phase difference between clocks of asynchronous domains of asynchronous crossings in the unfolded integrated circuit design.

2. The method of claim 1, further comprising:

determining, based on outputs of the one or more exclusive OR operations due to the sequential equivalence checking, whether the asynchronous crossings of the integrated circuit design are verified or not verified; and generating an output indicative of whether the asynchronous crossings of the integrated circuit design are verified or not verified based on results of the determination.

3. The method of claim 1, wherein the asynchronous crossing logic further comprises, for an asynchronous bus in the unfolded integrated circuit design, transitioning bit detection logic for detecting transitioning bits of strands of the asynchronous bus, and maximum delay logic for determining a maximum delay of strands having transitioning bits in the asynchronous bus.

4. The method of claim 3, wherein inserting the asynchronous crossing logic further comprises:

replicating the second model to generate a third model; and coupling, for the asynchronous bus in the second model, the maximum delay logic of the second model to random select inputs of the skewing logic associated with a corresponding asynchronous bus in the third model to thereby bypass the random select inputs.

5. A method, in a data processing system, for performing asynchronous verification of an integrated circuit design, comprising:

receiving a first model of the integrated circuit design;

unfolding paths within the first model that have asynchronous crossings to generate an unfolded integrated circuit design model;

inserting asynchronous crossing logic into the unfolded integrated circuit design model to generate a second model;

correlating outputs of the first model with outputs of the second model;

applying one or more exclusive OR operations to the correlated outputs of the first model and the second model;

performing sequential equivalence checking on the first model and second model utilizing the applied one or more exclusive OR operations;

determining, based on outputs of the one or more exclusive OR operations due to the sequential equivalence checking, whether the asynchronous crossings of the integrated circuit design are verified or not verified;

generating an output indicative of whether the asynchronous crossings of the integrated circuit design are verified or not verified based on results of the determination; and performing, by the data processing system, a failure analysis to determine if a failure of the asynchronous crossings is a real failure or a false failure in response to determining that the asynchronous crossings of the integrated circuit design are not verified.

6. The method of claim 5, further comprising:

determining if results of the failure analysis indicate a false failure of the asynchronous crossings; and generating an output indicating a real failure of the integrated circuit design and a need to modify the integrated circuit design if results of the failure analysis indicate a real failure occurred with the asynchronous crossings of the integrated circuit design.

7. The method of claim 5, further comprising:

determining if results of the failure analysis indicate a false failure of the asynchronous crossings; and generating an output indicating a false failure of the integrated circuit design and a need to modify the sequential equivalence checking of the first model and second model if results of the failure analysis indicate a false failure occurred with the asynchronous crossings of the integrated circuit design.

8. An apparatus, comprising:

a processor; and a memory coupled to the processor, wherein the memory comprises instructions which, when executed by the processor, cause the processor to:

receive a first model of the integrated circuit design;

unfold paths within the first model that have asynchronous crossings to generate an unfolded integrated circuit design model;

insert asynchronous crossing logic into the unfolded integrated circuit design model to generate a second model;

correlate outputs of the first model with outputs of the second model;

apply one or more exclusive OR operations to the correlated outputs of the first model and the second model; and perform sequential equivalence checking on the first model and second model utilizing the applied one or more exclusive OR operations, wherein the asynchronous crossing logic comprises skewing logic for selecting a phase difference between clocks of asynchronous domains of asynchronous crossings in the unfolded integrated circuit design.

9. The apparatus of claim 8, wherein the instructions further cause the processor to:

determine, based on outputs of the one or more exclusive OR operations due to the sequential equivalence checking, whether the asynchronous crossings of the integrated circuit design are verified or not verified; and generate an output indicative of whether the asynchronous crossings of the integrated circuit design are verified or not verified based on results of the determination.

10. The apparatus of claim 8, wherein the asynchronous crossing logic further comprises, for an asynchronous bus in the unfolded integrated circuit design, transitioning bit detection logic for detecting transitioning bits of strands of the asynchronous bus, and maximum delay logic for determining a maximum delay of strands having transitioning bits in the asynchronous bus.

11. The apparatus of claim 10, wherein inserting the asynchronous crossing logic further comprises:

replicating the second model to generate a third model; and coupling, for the asynchronous bus in the second model, the maximum delay logic of the second model to random select inputs of the skewing logic associated with a corresponding asynchronous bus in the third model to thereby bypass the random select inputs.

12. An apparatus, comprising:

a processor; and a memory coupled to the processor, wherein the memory comprises instructions which, when executed by the processor, cause the processor to:

receive a first model of the integrated circuit design;

unfold paths within the first model that have asynchronous crossings to generate an unfolded integrated circuit design model;

insert asynchronous crossing logic into the unfolded integrated circuit design model to generate a second model;

correlate outputs of the first model with outputs of the second model;

apply one or more exclusive OR operations to the correlated outputs of the first model and the second model;

perform sequential equivalence checking on the first model and second model utilizing the applied one or more exclusive OR operations;

determine, based on outputs of the one or more exclusive OR operations due to the sequential equivalence checking, whether the asynchronous crossings of the integrated circuit design are verified or not verified;

generate an output indicative of whether the asynchronous crossings of the integrated circuit design are verified or not verified based on results of the determination; and perform a failure analysis to determine if a failure of the asynchronous crossings is a real failure or a false failure in response to determining that the asynchronous crossings of the integrated circuit design are not verified.

13. The apparatus of claim 12, wherein the instructions further cause the processor to:

determine if results of the failure analysis indicate a false failure of the asynchronous crossings; and generate an output indicating a real failure of the integrated circuit design and a need to modify the integrated circuit design if results of the failure analysis indicate a real failure occurred with the asynchronous crossings of the integrated circuit design.

14. The apparatus of claim 12, wherein the instructions further cause the processor to:

determine if results of the failure analysis indicate a false failure of the asynchronous crossings; and generate an output indicating a false failure of the integrated circuit design and a need to modify the sequential equivalence checking of the first model and second model if results of the failure analysis indicate a false failure occurred with the asynchronous crossings of the integrated circuit design.

15. A computer program product comprising a computer recordable storage device having a computer readable program, wherein the computer readable program, when executed on a computing device, causes the computing device to:

receive a first model of the integrated circuit design;

unfold paths within the first model that have asynchronous crossings to generate an unfolded integrated circuit design model;

insert asynchronous crossing logic into the unfolded integrated circuit design model to generate a second model;

correlate outputs of the first model with outputs of the second model;

apply one or more exclusive OR operations to the correlated outputs of the first model and the second model; and perform sequential equivalence checking on the first model and second model utilizing the applied one or more exclusive OR operations, wherein the asynchronous crossing logic comprises skewing logic for selecting a phase difference between clocks of asynchronous domains of asynchronous crossings in the unfolded integrated circuit design.

16. The computer program product of claim 15, wherein the computer readable program further causes the computing device to:

determine, based on outputs of the one or more exclusive OR operations due to the sequential equivalence checking, whether the asynchronous crossings of the integrated circuit design are verified or not verified; and generate an output indicative of whether the asynchronous crossings of the integrated circuit design are verified or not verified based on results of the determination.

17. The computer program product of claim 15, wherein the asynchronous crossing logic further comprises, for an asynchronous bus in the unfolded integrated circuit design, transitioning bit detection logic for detecting transitioning bits of strands of the asynchronous bus, and maximum delay logic for determining a maximum delay of strands having transitioning bits in the asynchronous bus.

18. The computer program product of claim 17, wherein inserting the asynchronous crossing logic further comprises:

replicating the second model to generate a third model; and coupling, for the asynchronous bus in the second model, the maximum delay logic of the second model to random select inputs of the skewing logic associated with a corresponding asynchronous bus in the third model to thereby bypass the random select inputs.

19. A computer program product comprising a computer recordable storage device having a computer readable program, wherein the computer readable program, when executed on a computing device, causes the computing device to:

receive a first model of the integrated circuit design;

unfold paths within the first model that have asynchronous crossings to generate an unfolded integrated circuit design model;

insert asynchronous crossing logic into the unfolded integrated circuit design model to generate a second model;

correlate outputs of the first model with outputs of the second model;

apply one or more exclusive OR operations to the correlated outputs of the first model and the second model;

perform sequential equivalence checking on the first model and second model utilizing the applied one or more exclusive OR operations determine, based on outputs of the one or more exclusive OR operations due to the sequential equivalence checking, whether the asynchronous crossings of the integrated circuit design are verified or not verified;

generate an output indicative of whether the asynchronous crossings of the integrated circuit design are verified or not verified based on results of the determination; and perform a failure analysis to determine if a failure of the asynchronous crossings is a real failure or a false failure in response to determining that the asynchronous crossings of the integrated circuit design are not verified.

20. The computer program product of claim 19, wherein the computer readable program further causes the computing device to:

determine if results of the failure analysis indicate a false failure of the asynchronous crossings; and generate an output indicating a real failure of the integrated circuit design and a need to modify the integrated circuit design if results of the failure analysis indicate a real failure occurred with the asynchronous crossings of the integrated circuit design.

21. The computer program product of claim 19, wherein the computer readable program further causes the computing device to:

determine if results of the failure analysis indicate a false failure of the asynchronous crossings; and generate an output indicating a false failure of the integrated circuit design and a need to modify the sequential equivalence checking of the first model and second model if results of the failure analysis indicate a false failure occurred with the asynchronous crossings of the integrated circuit design.

* * * * *